United States Patent
Röhrer

(10) Patent No.: US 9,575,141 B2
(45) Date of Patent: Feb. 21, 2017

(54) HALL SENSOR WITH HALL SENSOR ELEMENTS THAT RESPECTIVELY COMPRISE ELEMENT TERMINALS AND ARE INTERCONNECTED IN A CIRCUIT LATTICE

(75) Inventor: Georg Röhrer, Lebring (AT)

(73) Assignee: AMS AG, Unterpremstaetten (AT)

( * ) Notice: Subject to any disclaimer, the term of this patent is extended or adjusted under 35 U.S.C. 154(b) by 97 days.

(21) Appl. No.: 14/350,799

(22) PCT Filed: Aug. 28, 2012

(86) PCT No.: PCT/EP2012/066697
§ 371 (c)(1),
(2), (4) Date: Jul. 14, 2014

(87) PCT Pub. No.: WO2013/053534
PCT Pub. Date: Apr. 18, 2013

(65) Prior Publication Data
US 2014/0327435 A1    Nov. 6, 2014

(30) Foreign Application Priority Data
Oct. 10, 2011   (DE) .......................... 10 2011 115 566

(51) Int. Cl.
*G01R 33/07*   (2006.01)
*G01R 33/00*   (2006.01)
*G01R 21/08*   (2006.01)

(52) U.S. Cl.
CPC ............. *G01R 33/072* (2013.01); *G01R 21/08* (2013.01); *G01R 33/0094* (2013.01); *G01R 33/07* (2013.01)

(58) Field of Classification Search
CPC ..... G01R 21/08; G01R 33/0094; G01R 33/07; G01R 33/072
(Continued)

(56) References Cited

U.S. PATENT DOCUMENTS

| 4,709,214 A | 11/1987 | Higgs |
| 4,982,155 A | 1/1991 | Ramsden |

(Continued)

FOREIGN PATENT DOCUMENTS

| CN | 201233438 Y | 5/2009 |
| CN | 101770981 A | 7/2010 |

(Continued)

OTHER PUBLICATIONS

Hébard, Luc et al., "A Chopper Stabilized Biasing Circuit Suitable for Cascaded Wheatstone-Bridge-Like Sensors", IEEE Transactions on Circuits and Systems-I: Regular Papers, vol. 52, No. 8, Aug. 2005, pp. 1653-1665.

(Continued)

*Primary Examiner* — Jay Patidar
(74) *Attorney, Agent, or Firm* — McDermott Will & Emery LLP

(57) ABSTRACT

A Hall sensor comprises at least three Hall sensor elements (1, 2, ..., 94) that respectively comprise at least three element terminals (A, B, C, D, E, F, G, H) and are interconnected in a circuit grid with a structure that is more than one-dimensional, as well as at least three sensor terminals (EXT_A, EXT_B, EXT_C, EXT_D) for contacting the Hall sensor. In this case, each sensor terminal (EXT_A, EXT_B, EXT_C, EXT_D) is connected to at least one of the Hall sensor elements (1, 2, ..., 94) at one of its element terminals (A, B, C, D, E, F, G, H).

22 Claims, 15 Drawing Sheets

(58) Field of Classification Search
USPC .......................................................... 324/251
See application file for complete search history.

(56) References Cited

U.S. PATENT DOCUMENTS

| | | | |
|---|---|---|---|
| 5,406,202 A | 4/1995 | Mehrgardt et al. | |
| 5,563,082 A | 10/1996 | Mukai | |
| 6,768,301 B1 | 7/2004 | Hohe et al. | |
| 7,073,291 B2 | 7/2006 | Kawanob et al. | |
| 7,345,476 B2 | 3/2008 | Middelhoek et al. | |
| 8,164,149 B2 | 4/2012 | Schott | |
| 9,007,060 B2 * | 4/2015 | Ausserlechner | G01L 1/12 324/207.2 |
| 2007/0046287 A1 | 3/2007 | Vervaeke et al. | |
| 2007/0290682 A1 * | 12/2007 | Oohira | G01R 33/07 324/251 |
| 2010/0042336 A1 * | 2/2010 | Lee | G01N 27/9006 702/38 |
| 2010/0123458 A1 | 5/2010 | Schott | |
| 2012/0286776 A1 * | 11/2012 | Ausserlechner | G01R 33/07 324/251 |
| 2014/0117983 A1 | 5/2014 | Rohrer | |

FOREIGN PATENT DOCUMENTS

| | | |
|---|---|---|
| CN | 101937063 A | 1/2011 |
| DE | 19943128 A1 | 4/2001 |
| DE | 10150955 C1 | 6/2003 |
| EP | 2071347 A2 | 6/2009 |
| EP | 2192417 A2 | 6/2010 |
| JP | 58154263 A * | 9/1983 |
| JP | 558154263 A | 9/1983 |
| JP | S62260376 A | 11/1987 |
| JP | H03252578 A | 11/1991 |
| JP | H0611556 | 1/1994 |
| JP | H06164015 A | 6/1994 |
| JP | 2005233652 A | 9/2005 |
| JP | 2007048847 A | 2/2007 |
| JP | 2007502965 A | 2/2007 |
| JP | 2007180215 A | 7/2007 |
| JP | 2008183988 A | 8/2008 |
| JP | 2014515823 A | 7/2014 |
| KR | 100676212 B1 | 1/2007 |
| WO | 03/036733 A2 | 5/2003 |
| WO | 2004/025742 A1 | 3/2004 |
| WO | 2005/073744 A1 | 8/2005 |

OTHER PUBLICATIONS

Lozanova, Siya et al., "Parallel-Field Silicon Hall Effects Microsensors With Minimal Design Complexity", IEEE Sensors Journal, vol. 9, No. 7, Jul. 2009, pp. 761-766.

Popovic, R.S., "Hall Effect Devices", Second Edition, Institute of Physics Publishing, Bristol and Philadelphia 2004, pp. 282-286.

* cited by examiner

Fig 11
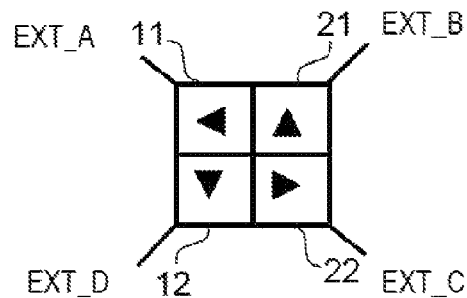
Fig 12A          Fig 12B          Fig 12C
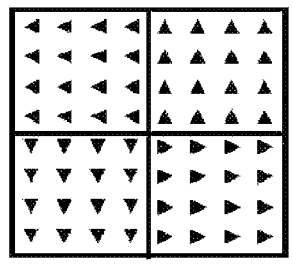 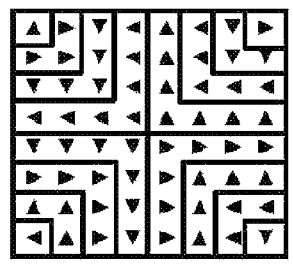 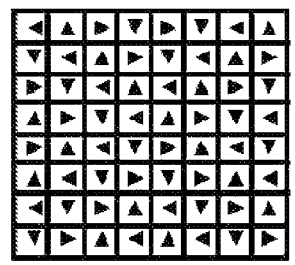
Fig 13
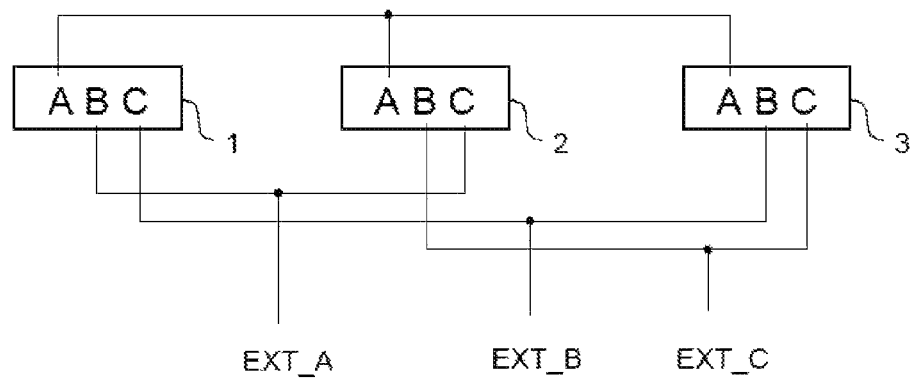

Fig 19
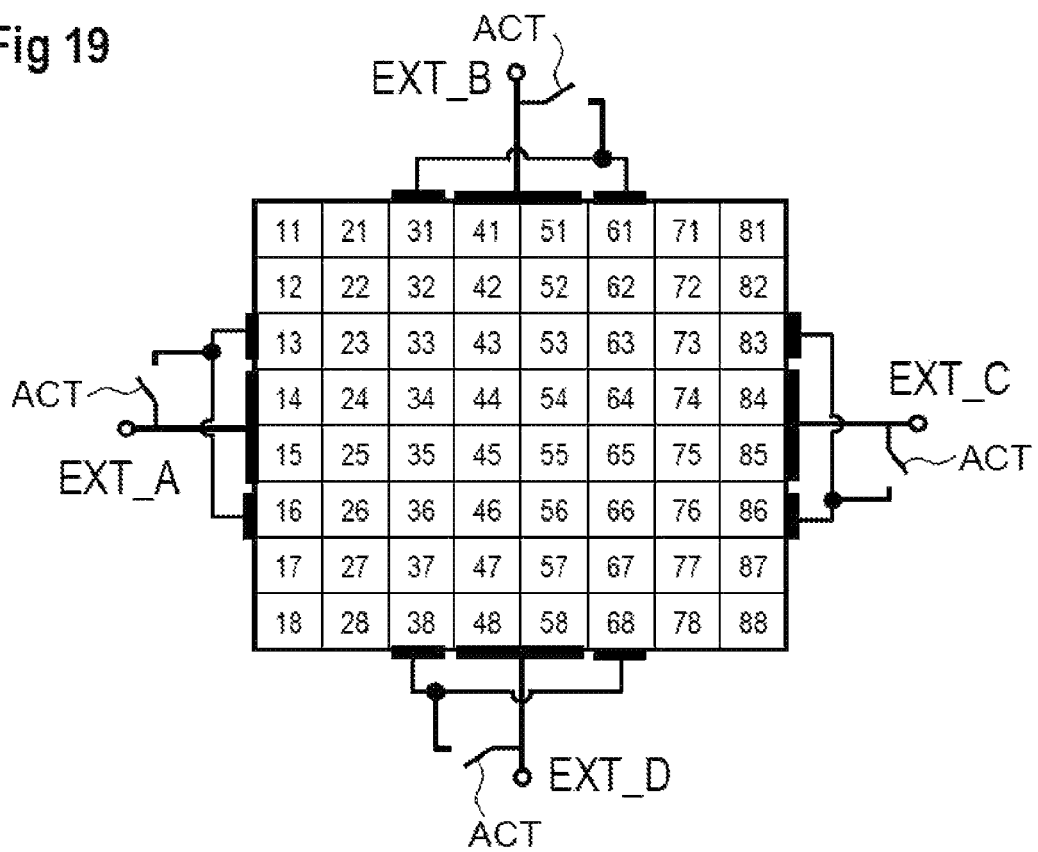
Fig 20
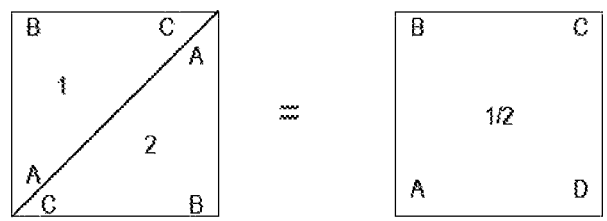
Fig 21
A(1)—B(1)—C(1)
A(2)—B(2)—C(2)   = A—B—C—D—A = A—B—C—D = E—A—B—C—D—E Fig 22
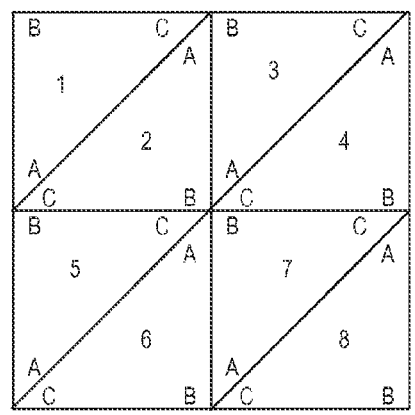
Fig 23
Fig 24
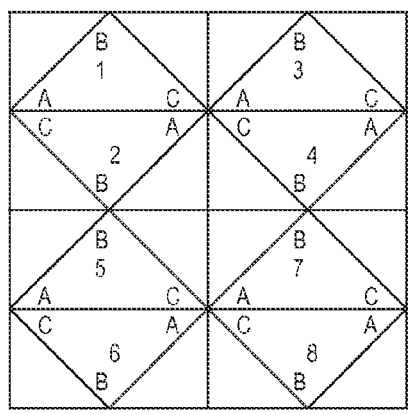

HALL SENSOR WITH HALL SENSOR ELEMENTS THAT RESPECTIVELY COMPRISE ELEMENT TERMINALS AND ARE INTERCONNECTED IN A CIRCUIT LATTICE

The invention pertains to a Hall sensor with several Hall sensor elements that are arranged on a semiconductor body.

The Hall effect named after American physicist Edwin Herbert Hall (1855-1938) occurs when a magnetic field is present perpendicular to an electric current. In this case, the magnetic field generates a potential difference that is referred to as Hall voltage in a direction that extends perpendicular to the direction of the magnetic field, as well as perpendicular to the direction of the current. A measurement of the Hall voltage makes it possible to determine the magnitude of the respective component of the magnetic field.

A Hall sensor used for measuring a Hall voltage may be realized in the form of a semiconductor device. An evaluation circuit may also be integrated into the semiconductor device and can be manufactured, for example, during the course of a CMOS process. If the plane of the active zone, in which the operating current flows and the Hall voltage occurs, is arranged coplanar to the upper side of the semiconductor body, it is possible to measure a Hall voltage caused by a component of the magnetic field that is directed perpendicular to the upper side. If the plane of the active zone is arranged perpendicular to the upper side, i.e. vertically within the semiconductor body, it is possible to measure a Hall voltage caused by a component of the magnetic field that is directed parallel to the upper side.

In Hall sensor semiconductor devices, the attainable sensitivity is limited by the mobility of the charge carriers in the semiconductor material used. In silicon, the maximum sensitivity of a Hall sensor measured in the form of the magnitude of the Hall voltage referred to the intensity of the magnetic field and the operating voltage lies at approximately 0.1 V/T. Although other semiconductor materials provide a higher charge carrier mobility, they are less suitable for an integration of the Hall sensor with the drive and evaluation electronics.

Hall sensors usually have an offset voltage that is not negligible. Such an offset voltage is the voltage that can be measured between two contacts of the Hall sensor without an external magnetic field being present at the Hall sensor.

In the textbook by R. S. Popovic "Hall Effect Devices," second edition, Institute of Physics Publishing, Bristol and Philadelphia 2004, methods that make it possible to reduce the offset voltage are described in Section 5.6.3 on Pages 282 to 286. These also include the method of rotary operating currents (Spinning-Current technique) and the pairing method (Pairing).

The offset voltage that remains after the utilization of these methods is referred to as residual offset voltage. With respect to the sensitivity of the Hall sensor, however, residual offset voltages that are greater than voltages resulting from the earth's magnetic field also remain if the described methods are utilized. The residual offset voltage accordingly limits the accuracy of the Hall sensor.

An objective to be attained consists of disclosing a Hall sensor with a high sensitivity and a low offset voltage.

This objective is attained with the subject matter of the independent claim. Enhancements and embodiments are defined in the dependent claims.

For example, three or more Hall sensor elements with a preferably identical design are arranged on a semiconductor body and are connected to one another, as well as to external terminals of the Hall sensor, by means of corresponding internal terminals of the Hall sensor elements. However, not all internal terminals of the Hall sensor elements also lead outward, i.e. to the external terminals of the Hall sensor, but some of the internal terminals are merely used for producing a connection between the individual Hall sensor elements. The Hall sensor can be contacted and operated like a conventional Hall sensor with at least three of the external terminals such that the number and the arrangement of the Hall sensor elements do not have to be taken into account externally.

The internal terminals can also be referred to as element terminals while the external terminals can also be referred to as sensor terminals.

For example, two of the sensor terminals serve for the delivery of a supply signal such as, e.g., a supply current for the Hall sensor, while at least one additional sensor terminal serves for tapping a measuring signal such as, e.g., a measuring voltage. The element terminals of the Hall sensor elements, in particular, routinely cannot be directly contacted externally, but rather only via the respective sensor terminals. In other words, element terminals are defined, among other things, in that no supply signal such as, e.g., a supply current. is delivered to the Hall sensor via these terminals. When individual element terminals of Hall sensor elements extend outward to terminals, these terminals only represent sensor terminals if they are required or used for contacting the Hall sensor during the operation of the Hall sensor, particularly at an operating time in the measuring mode. However, if an element terminal that extends outward is only used for internal purposes such as, for example, a measurement in the Hall sensor, such a terminal represents an additional auxiliary terminal of the Hall sensor.

The sensor terminals are functionally defined in that the plurality of interconnected Hall sensor elements can be contacted like an individual Hall sensor via the sensor terminals. In this respect, the sensor terminals differ from element terminals that optionally extend outward. The sensor terminals are designed, in particular, for contacting the Hall sensor during operation.

As a result of providing several Hall sensor elements and correspondingly interconnecting said Hall sensor elements, the residual offset voltage can be reduced and the accuracy can be simultaneously improved. This effect is based, for example, on the fact that an electric field in an individual Hall sensor element is reduced due to the interconnection of the Hall sensor elements, namely because the operating voltage applied to the sensor terminals is distributed over several Hall sensor elements.

The expression Hall sensor elements with an identical design refers to at least some of these Hall sensor elements having the same properties. For example, the Hall sensor elements comprise the same number of element terminals and/or have the same geometric dimensions. In different embodiments, it is also possible to interconnect Hall sensor elements that do not have an identical design.

In one embodiment, a Hall sensor comprises at least three Hall sensor elements, particularly Hall sensor elements with an identical design that respectively comprise at least three element terminals and are interconnected in a grid, particularly a circuit grid, with a structure that is more than one-dimensional, as well as at least three sensor terminals for contacting the Hall sensor. Each sensor terminal is at least connected to one of the Hall sensor elements at one of its element terminals.

Due to the grid, a two-dimensional or multidimensional interconnection of Hall sensor elements is respectively achieved. For example, an array-like interconnection is additionally realized due to the grid. In other words, at least one plane is defined by the Hall sensor elements that are interconnected in a grid-like fashion.

For example, a plurality of the Hall sensor elements are arranged in the form of an N×M grid or array, wherein N is greater than 1 and M is greater than 1. M and H can be equal or different. For example, N and M are an exponential number referred to the base 2. Three Hall sensor elements are interconnected, for example, diagonally such that one grid space in a 2×2 grid is unoccupied. The grid is realized, for example, in the form of an 8×8 grid, a 16×16 grid, a 32×32 grid or an even larger grid with a corresponding number of Hall sensor elements. The larger number of Hall sensor elements makes it possible to further reduce the offset voltage or the residual offset voltage. The grid does not have to be completely filled such that individual nodes of the grid may also remain unoccupied. Accordingly, it is also possible to realize circuit grids with a shape other than rectangular, for example a round or cruciform or polygonal shape. Due to the interconnection in the grid, a two-dimensional or a multidimensional interconnection of the Hall sensor elements is achieved.

In some embodiments, the individual Hall sensor elements are arranged in the grid in such a way that one or more columns or rows of the grid overlap with adjacent columns or rows, however, without the Hall sensor elements mandatorily overlapping one another. For example, the Hall sensor elements are interconnected in a honeycomb-shaped grid structure.

In one embodiment, the grid consists of a matrix that is more than one-dimensional. A one-dimensional matrix could be realized, for example, in the form of a plain series connection of several Hall sensor elements.

For example, each Hall sensor element is identified in the grid by a two-dimensional or multidimensional coordinate, for example by a pair of coordinates.

In one embodiment, for example, a Hall sensor with at least three Hall sensor elements, particularly Hall sensor elements with an identical design, is interconnected in such a way that in each possible combination of two respective sensor terminals, at least one signal path is formed between these two sensor terminals, wherein the number of Hall sensor elements that are connected in this signal path is smaller than the total number of Hall sensor elements of the Hall sensor.

Accordingly, a Hall sensor element may be connected, for example, to two sensor terminals, wherein two such connections are produced on different element terminals. In addition, each sensor terminal may also be connected to several Hall sensor elements. A plain parallel connection or a plain series connection of Hall sensor elements with respect to the sensor terminals is therefore not provided.

Due to the interconnection of the different Hall sensor elements, several signal paths that extend through a certain number of Hall sensor elements can usually be found from an arbitrary sensor terminal of the Hall sensor to another arbitrary terminal of the Hall sensor. In this case, the Hall sensor elements of the described Hall sensor are interconnected in such a way that a grid-shaped or array-like circuit is realized.

The Hall sensor elements are also not arranged, in particular, in the form of a plain series connection. In the described Hall sensor, it is accordingly always possible to respectively find at least one signal path that connects two sensor terminals via a number of Hall sensor elements that is smaller than the total number of Hall sensor elements of the Hall sensor. If several Hall sensor elements are functionally interconnected into a single Hall sensor element that is then accordingly connected in the Hall sensor, a respective signal path respectively extends only through this single Hall sensor element, but not through its components. For example, two Hall sensor elements that are entirely connected in parallel are regarded as a single Hall sensor element.

For example, the sensor terminals are used in pairs in order to apply a supply signal to one pair and to pick up a measuring signal at another pair. In accordance with the described circuit, the supply signal, as well as the measuring signal, respectively passes through several Hall sensor elements such that a reduced residual offset voltage is achieved.

In different embodiments, at least one element terminal of at least two or of all Hall sensor elements that is not connected to a sensor terminal is connected to another, particularly adjacent Hall sensor element at exactly one of its element terminals that is not connected to a sensor terminal. This respectively applies, in particular, to a certain operating point of the Hall sensor, at which the Hall sensor is contacted via certain sensor terminals.

In one embodiment, the Hall sensor is realized in such a way that no more than two element terminals of each Hall sensor element are respectively connected to one of the sensor terminals. Depending on the number of Hall sensor elements that the Hall sensor comprises, this ensures that no contact exists between a Hall sensor element and a sensor terminal or exactly one contact exists between an element terminal and a sensor terminal or exactly two contacts exist between two different element terminals of a Hall sensor element and two different sensor terminals. Particularly in a larger number of Hall sensor elements, the inner Hall sensor elements, for example, are not connected to the sensor terminals such that only outer Hall sensor elements contact the sensor terminals. In dependence on the arrangement of the different Hall sensor elements, for example, only one element terminal of the Hall sensor element is respectively connected to a sensor terminal that lies, for example, centrally on an outer face. In smaller arrangements, Hall sensor elements that respectively lie on corners or transition regions between two sensor terminals may also be connected to two sensor terminals.

In some preferred embodiments, at least one element terminal of all Hall sensor elements is not connected to a sensor terminal, but merely to an element terminal of another, particularly adjacent Hall sensor element. Accordingly, at least one element terminal of all Hall sensor elements that is not connected to a sensor terminal is connected to exactly one element terminal of an adjacent Hall sensor element that is not connected to a sensor terminal. This makes it possible to realize an improved interconnection of the Hall sensor elements that leads to a reduction in the residual offset voltage of the Hall sensor.

In different embodiments, the Hall sensor elements are arranged within a surface area that has a defined shape, for example, such that two Hall sensor elements are respectively arranged parallel and/or offset to one another. For example, the different Hall sensor elements produce a uniform pattern in the surface area. Accordingly, the Hall sensor elements are arranged in the surface area in a defined fashion with an identical orientation or a certain turned respectively rotated orientation in order to achieve advantageous characteristics with respect to the offset voltage or the residual offset voltage of the Hall sensor. The orientation of the Hall sensor elements is defined, for example, by a current flow direction through the element or by a geometric structure or by a special structure in a semiconductor well.

For example, the shape of the surface area, within which the Hall sensor elements are arranged, has at least one symmetric relationship such as, for example, a line symmetry or a point symmetry. In addition, the surface area may, for example, have one of the following, particularly symmetrical shapes: a rectangular shape, a square shape, a cruciform shape, a circular shape or the shape of an even polygon such as, for example, a hexagon or an octagon. In order to utilize the surface area defined, for example, on the semiconductor body as economically as possible, the shape and the size of the semiconductor elements are adapted to the shape of the surface area of the Hall sensor. For example, the surface area is divided into zones, in which one Hall sensor element adapted with respect to its shape is respectively arranged.

Individual Hall sensor elements that protrude over the edge of the surface area, particularly in case of a large number of Hall sensor elements, are macroscopically regarded as also being comprised by the surface area. Accordingly, it is also possible to forgo a strict symmetry of the surface area in different embodiments. The surface area or a partition of the surface area into sections essentially defines the type of interconnection of the Hall sensor elements such that the surface area can in different embodiments also be interpreted as a circuit surface area and the actual position of the Hall sensor elements is not dependent on the dimensions of the surface area.

In different embodiments, the Hall sensor elements that are connected to the sensor terminals are respectively arranged adjacent to the outer edge of the surface area. Furthermore, Hall sensor elements that are not arranged adjacent to the outer edge of the surface area are in different embodiments respectively connected to exactly one element terminal of an adjacent Hall sensor element, preferably at all their element terminals.

Accordingly, the Hall sensor elements of the Hall sensor form an interconnected grid that individually utilizes the properties of each Hall sensor element and is externally contacted like a single larger Hall sensor. Hall sensor elements that are not arranged adjacent to the outer edge of the surface area preferably are connected to respectively different adjacent Hall sensor elements at the individual element terminals. Accordingly, each element terminal of such a Hall sensor element is connected to another adjacent Hall sensor element.

Individual Hall sensors, particularly those arranged adjacent to the edge of the surface area, can be externally contacted, i.e., with the sensor terminals of the Hall sensor. The number of Hall sensor elements that are connected to one of the sensor terminals may be variable in different embodiments, wherein a contact is produced between each sensor terminal and at least one Hall sensor element.

In different embodiments, at least one connection between one of the sensor terminals and one of the element terminals is a fixed connection, for example, in the form of a hardwired connection or a defined coupling in the semiconductor body. Accordingly, each of the sensor terminals may be connected in a fixed fashion to one, two or more Hall sensor elements.

It is furthermore possible that the sensor terminals respectively comprise at least one switchable connection with at least one other Hall sensor element at exactly one of its element terminals in addition to the fixed connection. Such a switchable connection is preferably produced with a Hall sensor element arranged adjacent to a Hall sensor element that is also connected to this sensor terminal, namely regardless of whether this connection is fixed or switched.

The larger the number of Hall sensor elements that are connected to a sensor terminal, the lower the input resistance of the whole Hall sensor. Accordingly, the input resistance of the Hall sensor increases as the number of Hall sensor elements that are connected to the respective sensor terminals decreases. This property of the Hall sensor can be utilized during the operation of the Hall sensor or adapted to the requirements of the Hall sensor for a certain application. Accordingly, a Hall sensor with a defined input resistance can be provided. It is further possible to change the input resistance of the Hall sensor during operation by means of the switchable connection. For example, a high-resistance terminal configuration of the Hall sensor that results in a low current and therefore low energy consumption can be adjusted in an idle mode or standby mode of an arrangement that utilizes the Hall sensor. The accuracy of the Hall sensor is of secondary importance in this idle mode, but preferably fulfills the requirements of a significant measurement. A high accuracy is required, for example, in a normal operating mode such that the Hall sensor is operated with a low-resistance terminal configuration in this case. For example, more Hall sensor elements are connected to the sensor terminals by means of the switchable connection for this purpose.

The Hall sensor elements that jointly form the Hall sensor may consist of lateral Hall sensors that measure a magnetic field perpendicular to the surface of the Hall sensor or of vertical Hall sensors that measure a magnetic field parallel to the surface of the Hall sensor. The interconnection of several lateral Hall sensor elements accordingly makes it possible to realize a larger lateral Hall sensor that once again measures a magnetic field perpendicular to the surface of the Hall sensor elements. If the Hall sensor is composed of a plurality of vertical Hall sensor elements, a large vertical Hall sensor for measuring a magnetic field parallel to the surface of the Hall sensor is realized. Due to the plurality of Hall sensor elements, the accuracy or the sensitivity of the Hall sensor is increased for lateral Hall sensor elements, as well as for vertical Hall sensor elements, while the offset voltage or residual offset voltage is reduced.

With respect to their technical or geometric orientation, the individual Hall sensor elements may be interconnected uniformly or turned respectively rotated relative to one another. The technical orientation of a vertical Hall sensor element depends, in particular, on the respective element terminals that are contacted for the measurement.

In different embodiments, for example, the Hall sensor elements have an identical design and respectively comprise at least four element terminals that are formed by a first pair of element terminals and at least one second pair of element terminals. In at least some of the Hall sensor elements, a first element terminal of the first pair of a Hall sensor element is connected to one of the element terminals of the second pair of another, particularly adjacent Hall sensor element. In addition, a first element terminal of the second pair of this Hall sensor element is connected to one of the element terminals of the first pair of yet another, particularly adjacent Hall sensor element. In this embodiment, an interconnection of the Hall sensor elements that is turned with respect to their orientation is realized when using vertical Hall sensor elements, as well as when using lateral Hall sensor elements, such that different opposing interference effects in the Hall sensor elements compensate one another and contribute to a reduction in the residual offset voltage.

In another embodiment featuring Hall sensor elements with an identical design, a first element terminal of the first pair of a Hall sensor element is connected to a second element terminal of the first pair of another, particularly adjacent Hall sensor element and a first element terminal of the second pair of this Hall sensor element is connected to a second element terminal of the second pair of yet another, particularly adjacent Hall sensor element in the case of at least some of the Hall sensor elements. In this embodiment, the Hall sensor elements preferably are technically interconnected in an identical fashion. An identical interconnection that preferably leads to a similar current distribution in all Hall sensor elements during the operation of the Hall sensor is therefore realized, particularly when vertical Hall sensor elements are used. When using lateral Hall sensor elements, however, the Hall sensor elements may be additionally turned geometrically such that different effects are realized in the individual Hall sensor elements.

In different embodiments, all Hall sensor elements have an identical orientation with respect to the alignment of the first and second pair. This orientation corresponds, for example, to a uniform or identical interconnection of all Hall sensor elements.

In other embodiments, at least some of the Hall sensor elements have a different orientation with respect to the alignment of the first and second pair. This results, in particular, in the effect of a turned interconnection of the individual Hall sensor elements in the Hall sensor.

In a turned interconnection, the individual Hall sensor elements are arranged in the Hall sensor and are connected to the sensor terminals, for example, such that an identical or nearly identical current distribution in the Hall sensor is realized regardless of which pair of sensor terminals is contacted during the operation of the Hall sensor. Using the example of lateral Hall sensor elements, this is realized, for example, in that the Hall sensor elements are arranged in an assumed square surface area of the Hall sensor with such an orientation that a 90° rotation of the Hall sensor results in an identical or nearly identical image with respect to the rotation of the individual Hall sensor elements. For example, each quadrant of the square surface area accordingly has an identical design, but with a corresponding 90° rotation referred to the adjacent quadrant. In this way, a Hall sensor with high symmetry and therefore improved accuracy can be realized. The symmetry results from a circuit-related symmetry or also from a geometric symmetry of the shape of the Hall sensor.

In other embodiments featuring Hall sensor elements with an identical design, the Hall sensor comprises at least four Hall sensor elements that respectively comprise a first, a second, a third and a fourth element terminal. In at least one group of four of the Hall sensor elements, a common connection is produced between the first element terminal of a first Hall sensor element of the group, the second element terminal of a second Hall sensor element of the group, the third element terminal of a third Hall sensor element of the group and the fourth element terminal of a fourth Hall sensor element of the group. Respectively different element terminals of four Hall sensor elements accordingly are interconnected in at least some groups. Such an interconnection results, for example, when lateral Hall sensor elements are interconnected by means of corresponding contacting on the corners of the Hall sensor elements. The interconnection is realized accordingly when vertical Hall sensor elements are used. For example, the four Hall sensor elements of a group are arranged adjacently.

In at least one group of four of the Hall sensor elements, a common connection between the respective first element terminals of the Hall sensor elements of the group is produced in a modified embodiment. Accordingly, respectively identical element terminals of four Hall sensor elements are interconnected in at least some groups. For example, the four Hall sensor elements of a group are once again arranged adjacently. In at least one group of four of the Hall sensor elements, a common connection is alternatively produced between the first element terminal of a first Hall sensor element of the group, the third element terminal of a second Hall sensor element of the group, the first element terminal of a third Hall sensor element of the group and the third element terminal of a fourth Hall sensor element of the group. Accordingly, two identical element terminals of two Hall sensor elements are connected to two respectively identical element terminals of two other Hall sensor elements in at least some groups. When lateral Hall sensor elements are used, for example, they may also be geometrically turned relative to one another.

In one embodiment, the Hall sensor comprises at least four Hall sensor elements that respectively comprise at least three element terminals and a first, a second, a third and a fourth sensor terminal, in particular exactly four sensor terminals. Two respective sensor terminals jointly form a first and a second pair. In this case, the Hall sensor elements are interconnected, particularly with a point symmetry, in such a way that an electrical behavior between the terminals of the first pair is identical to an electrical behavior between the terminals of the second pair.

The symmetry is achieved, for example, in that four quadrants are formed with respect to the circuit in the Hall sensor, wherein each quadrant has an identical design except for a geometric rotation of Hall sensor elements or a circuit-related rotation of element terminals of the Hall sensor elements. During a so-called rotation of the Hall sensor element, a circuit design identical to the circuit design that existed at the other terminals prior to the rotation can be realized at the turned terminals.

In another embodiment, the Hall sensor comprises at least three Hall sensor elements that respectively comprise three element terminals and a first, a second and a third sensor terminal, in particular exactly three sensor terminals. A respective combination of two of the sensor terminals forms a first, a second and a third pair. In this case, the Hall sensor elements are interconnected, particularly with a circuit symmetry, in such a way that an electrical behavior between the terminals of the first, the second and the third pair is identical.

In different embodiments, each Hall sensor element functionally comprises exactly one Hall sensor element or a combination of several interconnected Hall sensor elements. Each of the Hall sensor elements may once again be realized, in particular, in the form of a Hall sensor according to one of the described embodiments. However, it is also possible to realize a functional Hall sensor element by means of a parallel connection or a different connection between several individual Hall sensor elements. Furthermore, other circuit types can also be realized with several Hall sensors according to the described embodiments. It is also possible to operate a Hall sensor according to one of the described embodiments in arbitrary driving variations or operating variations like a conventional Hall sensor.

The Hall sensors described in the different embodiments can be readily operated with the initially described methods such as the Current-Spinning technology or Pairing because the Hall sensor acts and is contacted like a single Hall sensor regardless of the number of Hall sensor elements it comprises.

Particularly when vertical Hall sensor elements are used, they can be realized with small dimensions and, in particular, a small well depth in order to obtain Hall sensor elements with high accuracy. This makes it possible to accordingly manufacture a larger vertical Hall sensor that has a comparatively higher accuracy, but still does not require a great well depth. This is also advantageous with respect to the manufacturing process.

The principle of interconnecting individual Hall sensor elements described with reference to the preceding embodiments can likewise be utilized when magnetic fields that extend at an angle to one another, for example at a right angle to one another, and parallel to the surface of the Hall sensor should be measured with two vertical Hall sensors. In this case, the vertical Hall sensor elements may be arranged, in particular, in an identical region of the semiconductor body, but with a different geometric orientation, wherein a portion of the Hall sensor elements belong to one Hall sensor and the remaining portion of the Hall sensor elements belongs to the other Hall sensor. Accordingly, a two-dimensional magnetic field measurement can be realized on the same region of the semiconductor body in this way.

Several exemplary embodiments of the invention are described in greater detail below with reference to the figures. In these figures, elements or components with identical function are identified by the same reference symbols. The description of circuit components or devices that correspond with respect to their function is not repeated with reference to each of the following figures.

Figure 4:
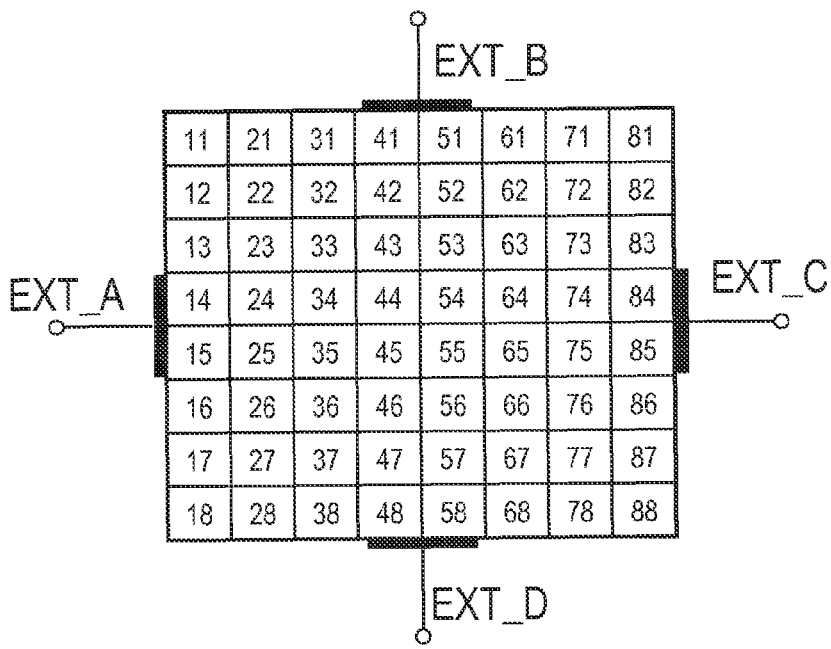
Figure 5:
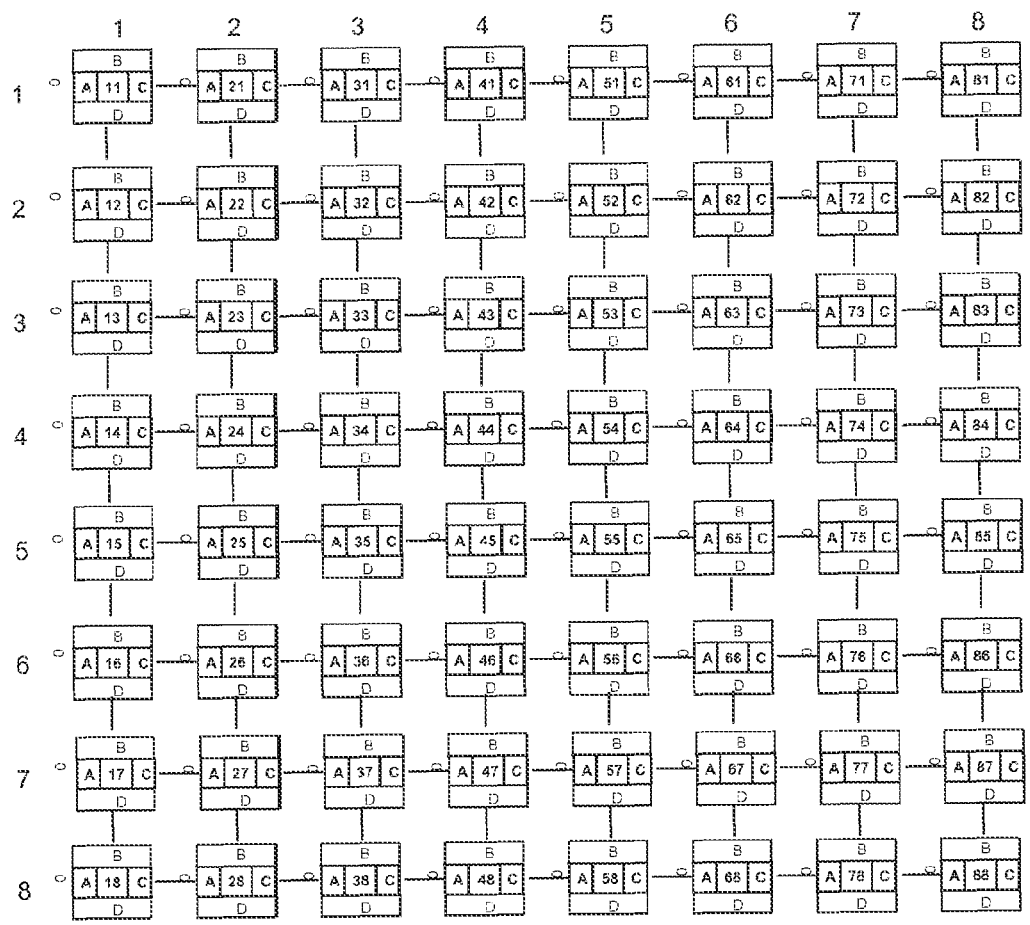
Figure 6:
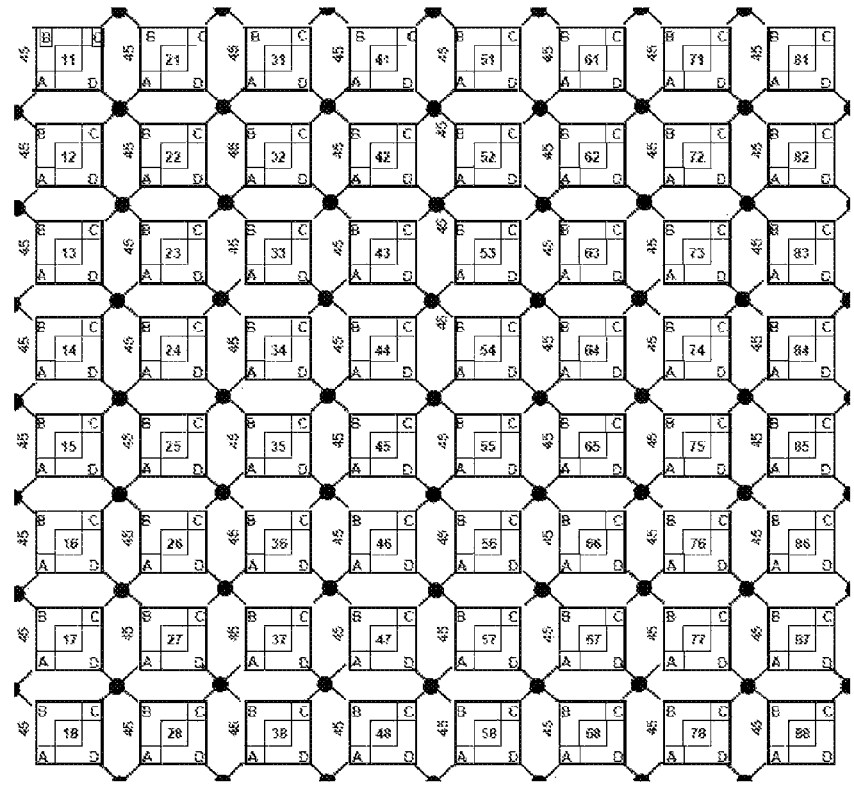
Figure 7A:
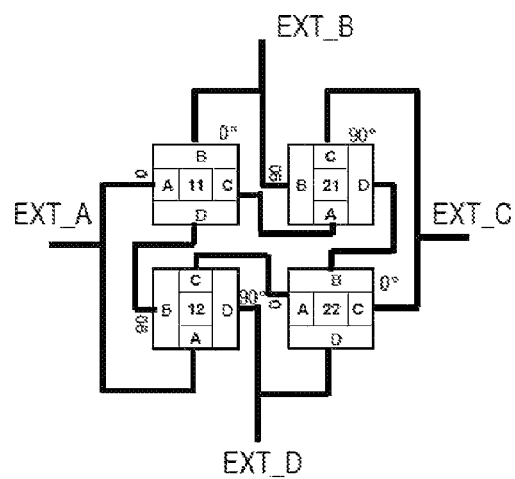
Figure 7B:
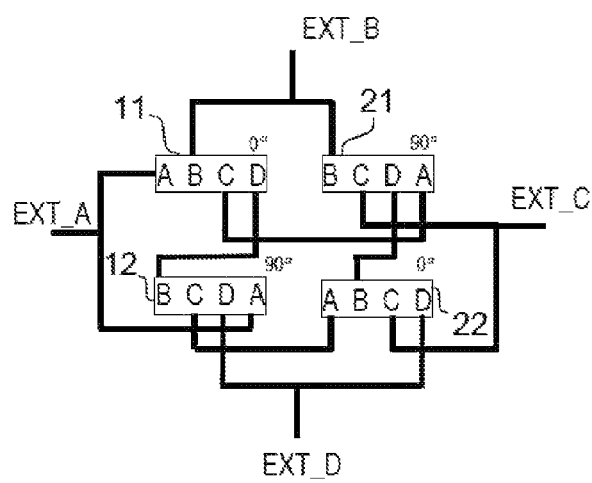
Figure 8:
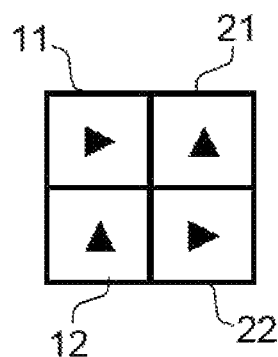
Figure 9:
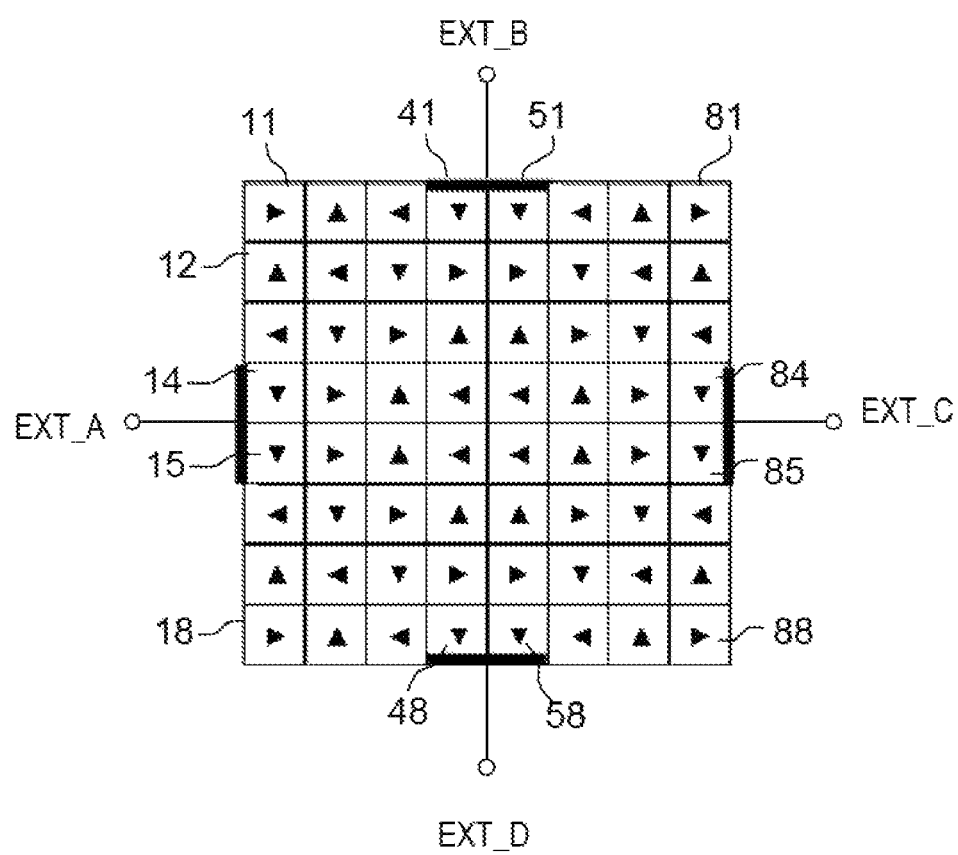
Figure 14A:
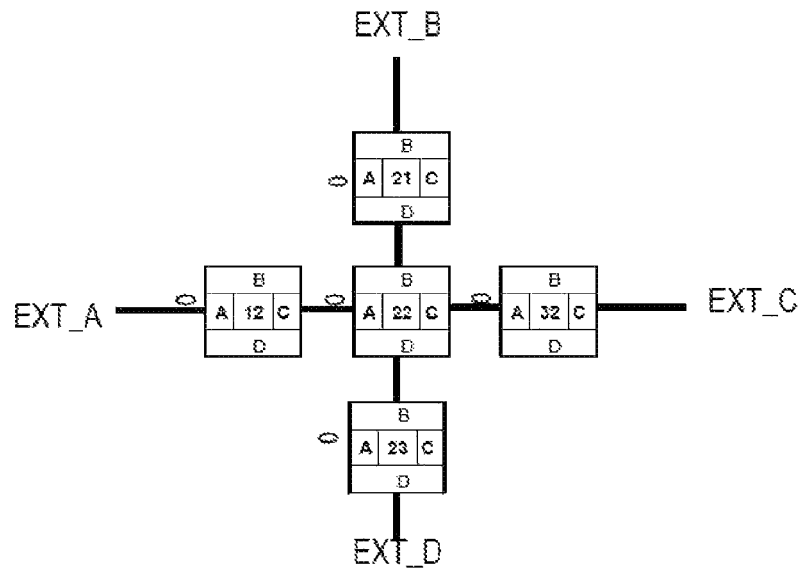
Figure 14B:
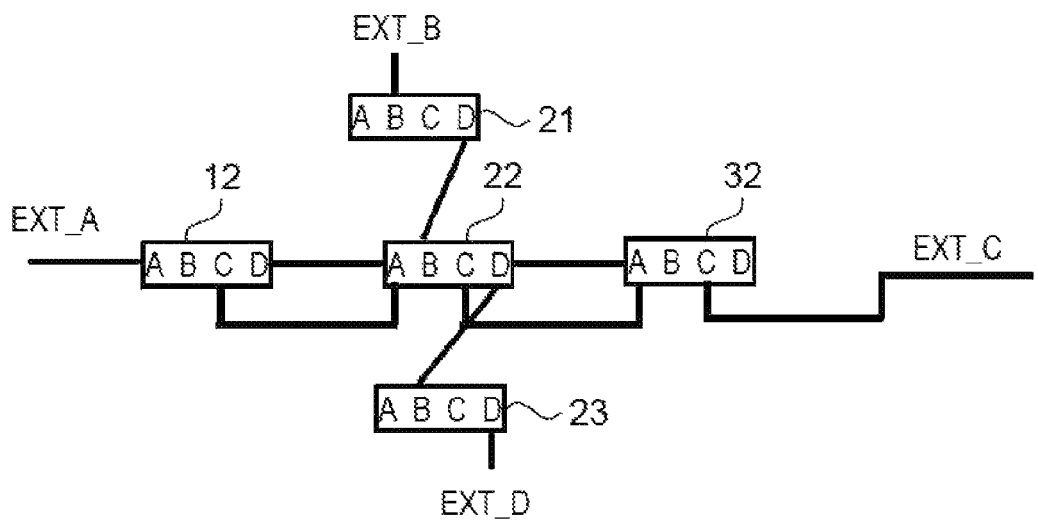
Figure 15:
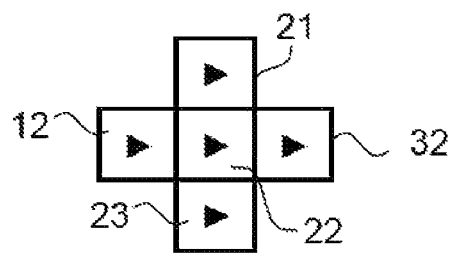
Figure 16:
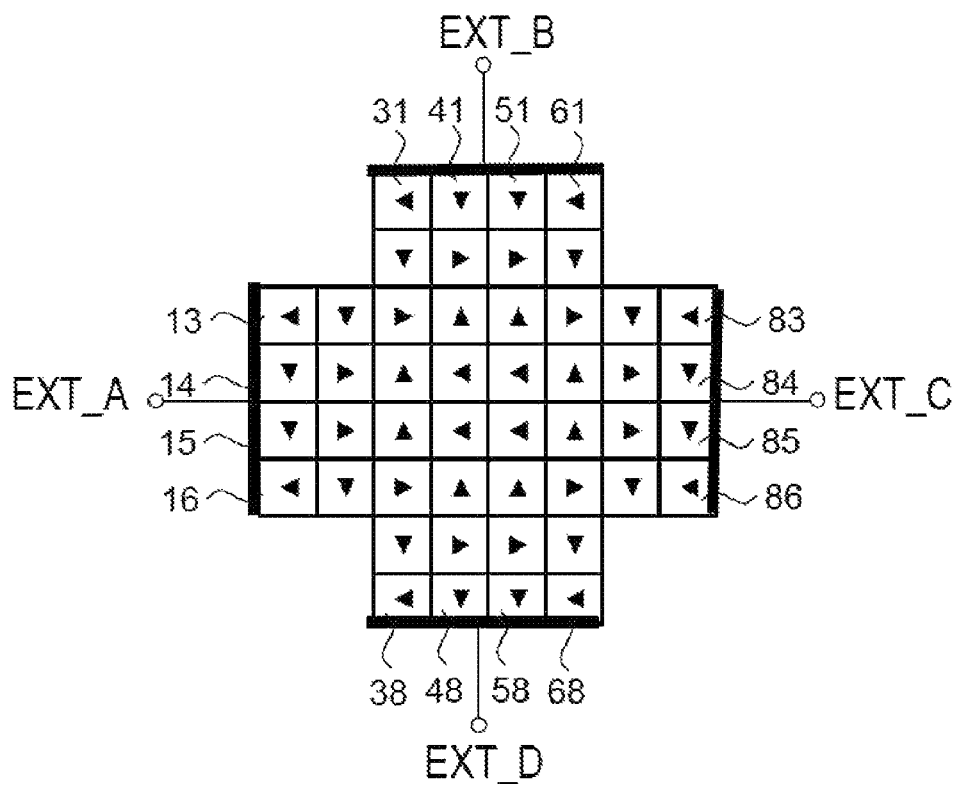
Figure 17:
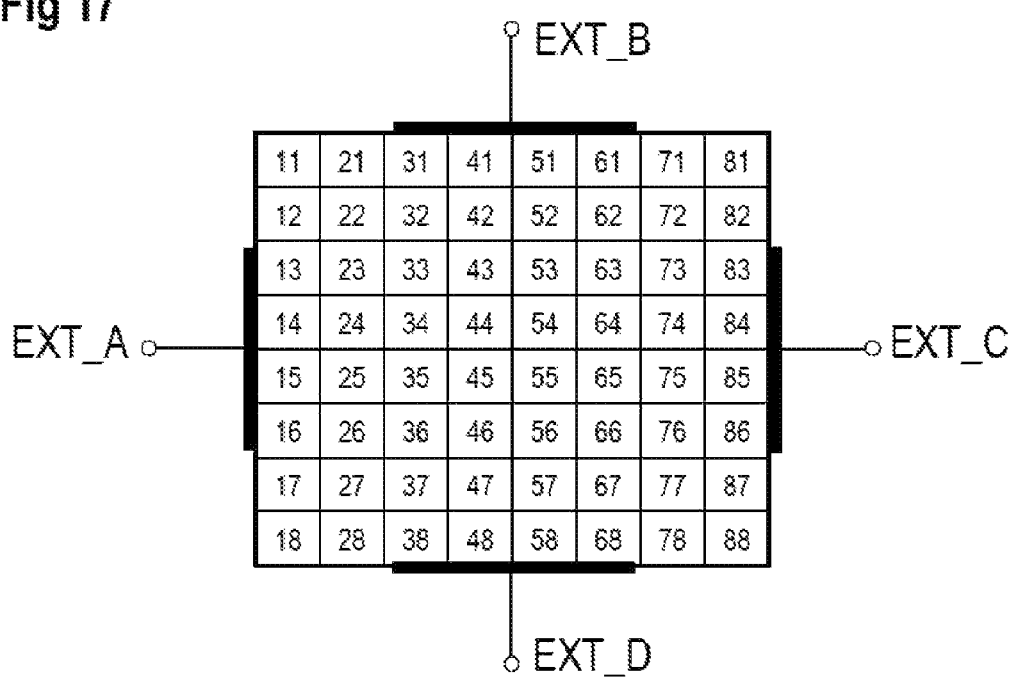
Figure 25:
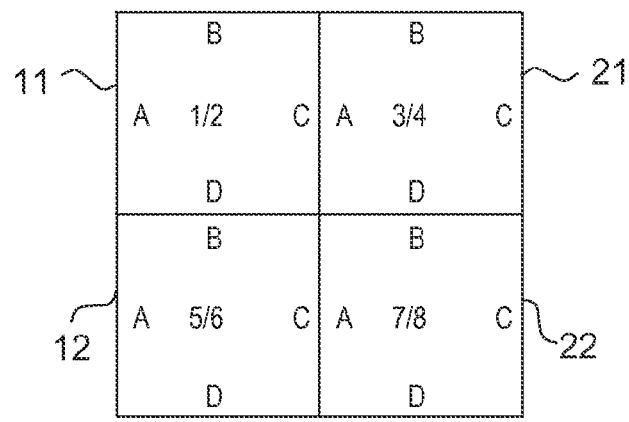
Figure 27:
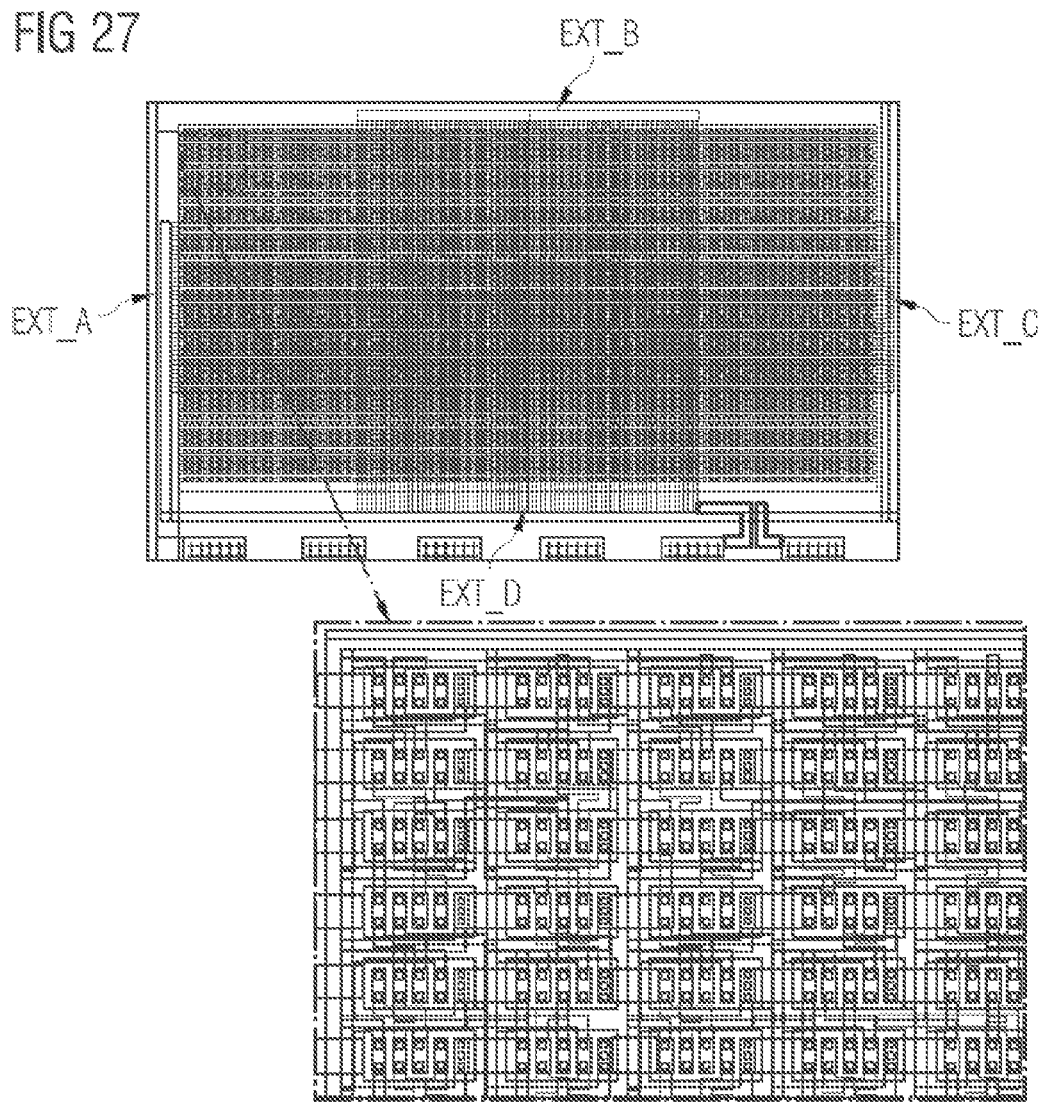

FIG. 4 shows another embodiment of a Hall sensor with several Hall sensor elements, FIG. 5 shows another embodiment of a Hall sensor with several Hall sensor elements, FIG. 6 shows another embodiment of a Hall sensor with several Hall sensor elements, FIG. 7 shows another embodiment of a Hall sensor with several Hall sensor elements, FIG. 8 shows a schematic illustration of another embodiment of a Hall sensor, FIG. 9 shows a schematic illustration of another embodiment of a Hall sensor, FIG. 10 shows other embodiments of a Hall sensor with several Hall sensor elements, FIG. 11 shows a schematic illustration of another embodiment of a Hall sensor, FIG. 12 shows different schematic illustrations of embodiments of a Hall sensor with several Hall sensor elements, FIG. 13 shows a schematic illustration of another embodiment of a Hall sensor, FIG. 14 shows other embodiments of a Hall sensor with several Hall sensor elements, FIG. 15 shows a schematic illustration of another embodiment of a Hall sensor, FIG. 16 shows a schematic illustration of another embodiment of a Hall sensor, FIG. 17 shows a schematic illustration of another embodiment of a Hall sensor, FIG. 18 shows other embodiments of a Hall sensor with several Hall sensor elements, FIG. 19 shows a schematic illustration of another embodiment of a Hall sensor, FIG. 20 shows a schematic illustration of an embodiment of Hall sensor elements, FIG. 21 shows another schematic illustration of embodiments of Hall sensor elements, FIG. 22 shows another embodiment of a Hall sensor with several Hall sensor elements, FIG. 23 shows another embodiment of a Hall sensor with several Hall sensor elements, FIG. 24 shows another embodiment of a Hall sensor with several Hall sensor elements, FIG. 25 shows another embodiment of a Hall sensor with several Hall sensor elements, FIG. 26 shows another schematic illustration of embodiments of Hall sensor elements, and FIG. 27 shows an exemplary illustration of a layout of an embodiment of a Hall sensor with several Hall sensor elements.

Figure 28A:
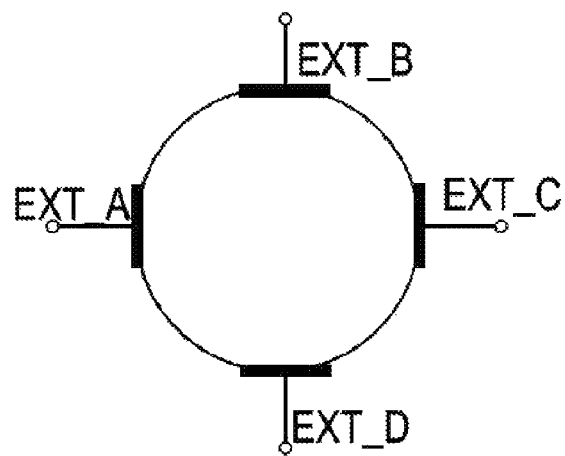
Figure 28B:
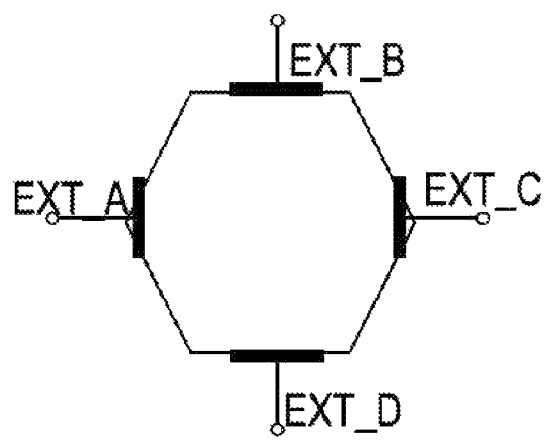
Figure 28C:
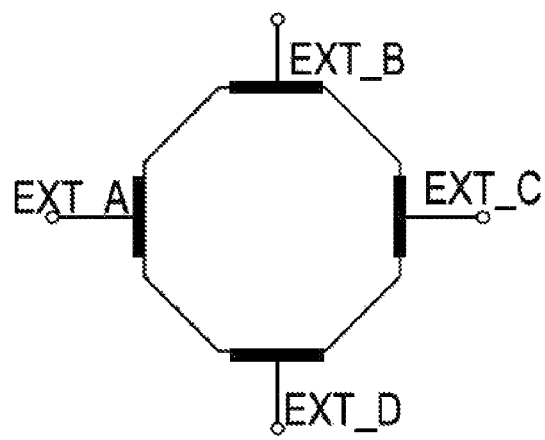

FIGS. 28A-C show different schematic illustrations of further embodiments of a Hall sensor with several Hall sensor elements.

Figure 1A:
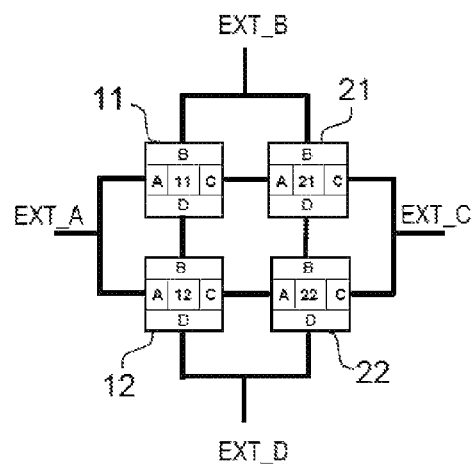
FIG. 1 shows embodiments of a Hall sensor with several Hall sensor elements.
Figure 1B:
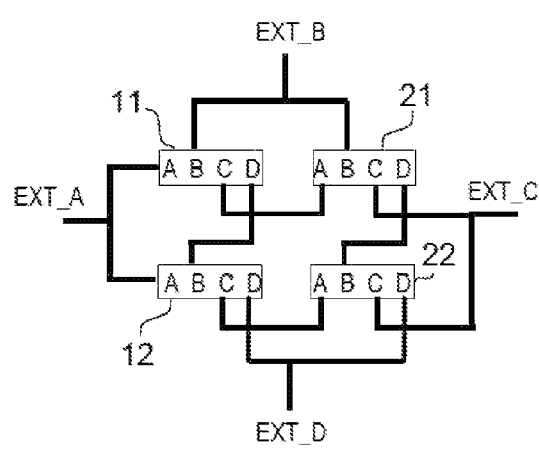

FIG. 1 shows different embodiments of a Hall sensor with several Hall sensor elements 11, 12, 21, 22 that are interconnected and in this way jointly form a larger Hall sensor. FIG. 1A shows an embodiment with lateral Hall sensor elements while vertical Hall sensor elements are used in FIG. 1B. In the two embodiments illustrated in FIG. 1A and FIG. 1B, the Hall sensor elements 11, 12, 21, 22 respectively comprise four element terminals or element terminals A, B, C, D, some of which are connected to adjacent Hall sensor elements and some of which are connected to external terminals or sensor terminals EXT_A, EXT_B, EXT_C, EXT_D. The circuitry is realized analogously in both embodiments such that the following description of the circuitry applies to FIG. 1A and FIG. 1B.

In the Hall sensor, the element terminals A of the Hall sensor elements 11, 12 are jointly connected to the sensor terminal EXT_A. Similarly, the element terminals B of the elements 11, 21 are connected to the sensor terminal EXT_B, the element terminals C of the elements 21, 22 are connected to the sensor terminal EXT_C and the element terminals D of the elements 12, 22 are connected to the sensor terminal EXT_D. In addition, the terminals D of the element 11 and B of the element 12, the terminals C of the element 11 and A of the element 21, the terminals D of the element 21 and B of the element 22, as well as the terminals C of the element 12 and A of the element 22, are connected to one another.

For example, the Hall sensor elements 11, 12, 21, 22 are arranged on a surface area of a semiconductor body that has a square or rectangular shape. The embodiments symbolically illustrated in FIGS. 1A and 1B can be interpreted as top views of the surface area or surface of the semiconductor body. The Hall sensor elements may also consist of individual discrete elements.

In the embodiments illustrated in FIG. 1A and FIG. 1B, the individual Hall sensor elements 11, 12, 21, 22 are arranged with an identical orientation, particularly with an identical geometric orientation, as well as an identical circuit-related orientation, such that essentially similar current distributions result in the individual Hall sensor elements during the operation of the Hall sensor. For example, a signal or signal flow results, in particular, between the element terminals A and C that are connected to the sensor terminals EXT_A, EXT_C, as well as between the element terminals B, D that are connected to the sensor terminals EXT_B, EXT_D.

Figure 2:
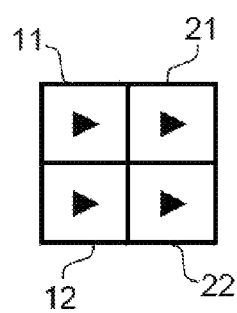
FIG. 2 shows a schematic illustration of an embodiment of a Hall sensor.

This orientation is schematically illustrated as an example in FIG. 2, wherein the direction of the arrow in the individual Hall sensor elements 11, 12, 21, 22 represents an exemplary orientation that is defined, for example, by a current flow direction in the Hall sensor element between the element terminals A, C.

Figure 3A:
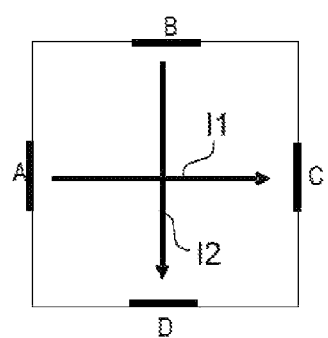
FIG. 3 shows embodiments of a Hall sensor element.

FIG. 3 shows exemplary Hall sensor elements and their potential current flow directions during operation. In this case, FIG. 3A shows an embodiment of a lateral Hall sensor element, in which a current 11 flows from the element terminal A to the element terminal C in one operating phase, e.g., of the spinning-current technique, while a current 12 flows from the element terminal B to the element terminal D in another operating phase. Contacts for the element terminals A, B, C, D are respectively provided, for example, centrally on the sides of the square lateral Hall sensor element shown. Such a lateral Hall sensor element makes it possible to measure a magnetic field perpendicular to the square surface of the element shown.

Figure 3B:
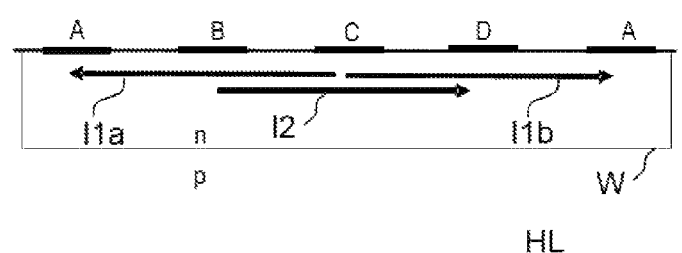

FIG. 3B shows an embodiment of a vertical Hall sensor element, in which an n-doped well W is provided, for example, in a p-doped semiconductor body HL. Contact areas for the element terminals A, B, C, D are respectively provided on the surface of the semiconductor body HL and the well W, wherein the contact for the element terminal A is realized in the form of a double contact or symmetric contact.

Analogous to the lateral Hall sensor element illustrated in FIG. 3A, a current flow from the element terminal C to the contacts of the element terminal A that is identified by the current arrows I1a, I1b takes place in the vertical Hall sensor element according to FIG. 3B in a first operating phase. In a second operating phase, a current flow 12 analogously takes places from the element terminal B to the element terminal D. The Hall sensor element illustrated in FIG. 3B makes it possible to measure a magnetic field parallel to the surface of the semiconductor body HL and the well W. The measurement being carried out particularly concerns a magnetic field that, metaphorically speaking, extends perpendicularly into the illustration in FIG. 3B.

The sensitivity and the residual offset of a vertical Hall sensor element not only depend on the physical distance between the external contacts, but also on a well depth of the well W. In order to obtain a larger vertical Hall sensor, the well depth is therefore increased in conventional Hall sensors. However, the realization of a great well depth is limited by process-related circumstances such that no arbitrary sizes can be achieved in conventional Hall sensors. However, the interconnection of several smaller vertical Hall sensor elements with limited well depth in accordance with the principle described with reference to FIG. 1B makes it possible to realize a larger Hall sensor that with respect to the sensor terminals EXT_A, EXT_B, EXT_C, EXT_D acts like a larger Hall sensor. The interconnection of the Hall sensor elements 11, 12, 21, 22 results in a larger Hall sensor with improved accuracy or sensitivity. In addition, the interconnection of the Hall sensor elements makes it possible to reduce an offset voltage or residual offset voltage of the Hall sensor, particularly in relation to a conventional Hall sensor with similar size. This is a consequence, among other things, of a Hall voltage distributing over the individual Hall sensor elements at the sensor terminals and thusly reducing the electric field in the individual Hall sensor elements. The reduced electric field results in an improved behavior with respect to the offset voltage.

Externally, the Hall sensor can be operated like a conventional Hall sensor and, in particular, also interconnected to other Hall sensors. Furthermore, it is possible to operate such a Hall sensor with conventional techniques such as the Current-Spinning technique and Pairing in order to realize an additional reduction in the offset voltages or residual offset voltages.

FIG. 4 shows another embodiment of a Hall sensor that is based on the principle described with reference to FIG. 1 and FIG. 2. In this case, the Hall sensor has a two-dimensional 8×8 grid of Hall sensor elements, i.e. a total of 64 Hall sensor elements that are identified by the reference symbols 11, 12, . . . , 88. The Hall sensor once again comprises four sensor terminals EXT_A, EXT_B, EXT_C, EXT_D that are respectively connected to two of the Hall sensor elements. In particular, the sensor terminal EXT_A is connected to the Hall sensor elements 14, 15, the sensor terminal EXT_B is connected to the Hall sensor elements 41, 51, the sensor terminal EXT_C is connected to the Hall sensor elements 84, 85 and the sensor terminal EXT_D is connected to the Hall sensor elements 48, 58. For example, all Hall sensor elements 11, 12, . . . , 88 have an identical design and also the same orientation, e.g. the orientation illustrated in FIG. 2. Due to the larger number of Hall sensor elements, the residual offset voltage can be additionally reduced.

The Hall sensor elements used in the Hall sensor according to FIG. 4 may, for example, once again consist of lateral Hall sensor elements or vertical Hall sensor elements.

FIG. 5 shows an exemplary embodiment with 64 Hall sensor elements that are realized in the form of lateral Hall sensor elements. Similar to the embodiment illustrated in FIG. 1A, all Hall sensor elements are contacted centrally on the side of the square base and not turned. In the drawing, this is indicated with the angle 0 (°). The contacting with the sensor terminals EXT_A, EXT_B, EXT_C, EXT_D is respectively realized, for example, analogous to the embodiment according to FIG. 4 on the Hall sensor elements in the row with the elements 14, 15 and the column with the elements 41, 51.

FIG. 6, in contrast, shows a Hall sensor with 64 Hall sensor elements that are contacted on the corners of the square base. This figure shows that the inner Hall sensor elements are respectively connected to one another on the corners such that four different element terminals A, B, C, D of different Hall sensor elements are respectively interconnected. The contacting on the corners results in a current flow or signal flow that extends diagonally through the Hall sensor element similar to the principle described with reference to FIG. 3A. In the drawing, this is indicated with the angle 45 (°).

The contacting of the Hall sensor elements illustrated in FIG. 6 can be implemented with little effort, for example, on a semiconductor body. The contacting with the sensor terminals EXT_A, EXT_B, EXT_C, EXT_D is realized, for example, on the respective element terminals of the Hall sensor elements 18, 11, 81, 88 that lie in the corners for the terminals EXT_A, EXT_B, EXT_C, EXT_D. Alternatively, the contacting with the sensor terminals EXT_A, EXT_B, EXT_C, EXT_D may also be realized in accordance with the interconnection illustrated in FIG. 4, i.e., on the respective Hall sensor elements in the row with the elements 14, 15 and the column with the elements 41, 51.

The individual Hall sensor elements in the above-described embodiments of the Hall sensors respectively have the same alignment or orientation whereas FIG. 7 shows other embodiments of a Hall sensor with several Hall sensor elements that are respectively interconnected and arranged such that their orientation is turned relative to one another. In this case, FIG. 7A once again shows an embodiment of a Hall sensor with lateral Hall sensor elements 11, 12, 21, 22 and FIG. 7B shows an embodiment of a Hall sensor with vertical Hall sensor elements 11, 12, 21, 22.

In comparison with the embodiments illustrated in FIG. 1A and FIG. 1B, the Hall sensor elements 12, 21 are respectively turned by 90° geometrically in FIG. 7a and electrically in FIG. 7B whereas the nominal connection of the element terminals A, B, C, D to one another and to the sensor terminals is identical. With lateral Hall sensor elements, the orientation of the individual element results, for example, from different metallization layers produced such that they are turned relative to one another. However, lateral Hall sensor elements may also be structured symmetrically, in particular rotationally symmetrical referred to the metallization layers. Due to the rotation of some of the Hall sensor elements, a compensation of the different directional effects that respectively contribute a portion to the offset voltage takes place during the operation of the Hall sensor such that the overall offset is reduced.

The lateral Hall sensor elements are turned relative to one another in the form of an actual geometric rotation of the individual Hall sensor elements, whereas this is realized in the form of a rotated contacting of the semiconductor well W in the embodiment with vertical Hall sensor elements according to FIG. 7B. For example, the Hall sensor elements 11, 22 in FIG. 7B are not turned and their element terminals have the contact sequence A-B-C-D whereas a 90° rotation of the elements 12, 21 is realized with the contact sequence B-C-D-A, i.e. with a rotation of the terminals. With respect to the reduction in the offset, however, the same internal offset compensation effects as in FIG. 7A are also achieved with the vertical Hall sensor elements or the Hall sensor formed thereof.

The respective principle of the rotation or the partially turned arrangement of Hall sensor elements is schematically illustrated in FIG. 8, wherein the direction of the arrow indicates a corresponding orientation of the respective Hall sensor element analogous to FIG. 2.

The principle of rotation can once again be expanded to a larger number of Hall sensor elements as illustrated in the form of an exemplary 8×8 grid in FIG. 9. In this case, the individual Hall sensor elements may once again be realized in the form of lateral Hall sensor elements or vertical Hall sensor elements. The respective orientation of the individual Hall sensor elements can be chosen arbitrarily, particularly also application-dependent. In this respect, the choice of orientations illustrated in FIG. 9 should merely be interpreted as an example.

For example, the orientation of the individual elements is chosen such that a Hall sensor with a largely symmetric structure is formed. For this purpose, the individual Hall sensor elements are arranged or contacted such that, viewed from the sensor terminals, an identical or similar configuration exists in all sensible terminal combinations.

In the embodiments shown, the Hall sensor elements are illustrated square or rectangular. With respect to the outer envelope of the Hall sensor, however, the Hall sensor elements may also be realized cruciform or round or with any known shape such as, for example, the shape of a bridge, the shape of a cloverleaf or the like. The contacting of the element terminals takes place in dependence on the shape, for example on the faces of a cruciform Hall sensor element. In different embodiments, the element terminals of the lateral Hall sensor elements may be arranged at any point of the circumference or the envelope of the circumference, for example, of circular or oval Hall sensor elements. In angular Hall sensor elements, the element terminals may be accordingly positioned on lateral faces in variable width and/or on the corners of the Hall sensor elements.

FIG. 10 shows an exemplary embodiment of a Hall sensor with four Hall sensor elements 11, 12, 21, 22, in which such a principle is realized. In this case, FIG. 10A and FIG. 10C show embodiments with lateral Hall sensor elements and FIG. 10B and FIG. 10D show embodiments with vertical Hall sensor elements.

Figure 10A:
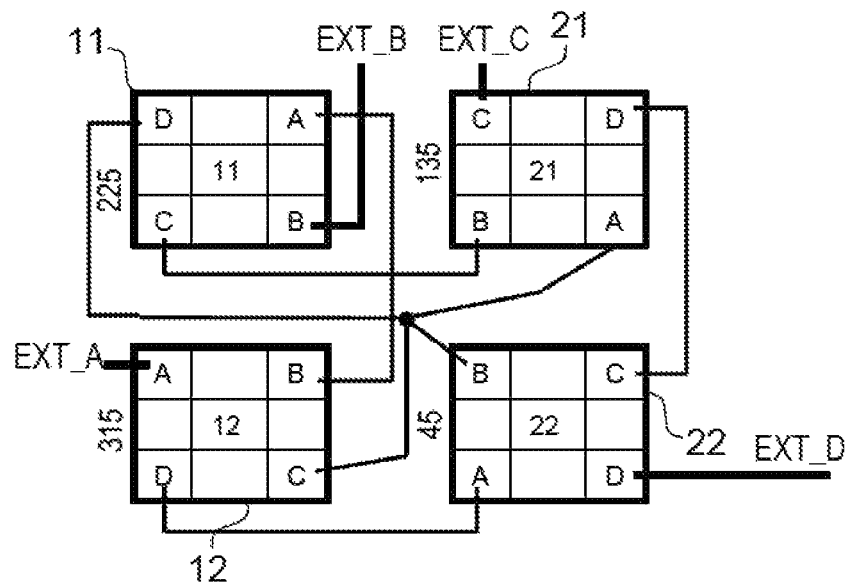
Figure 10B:
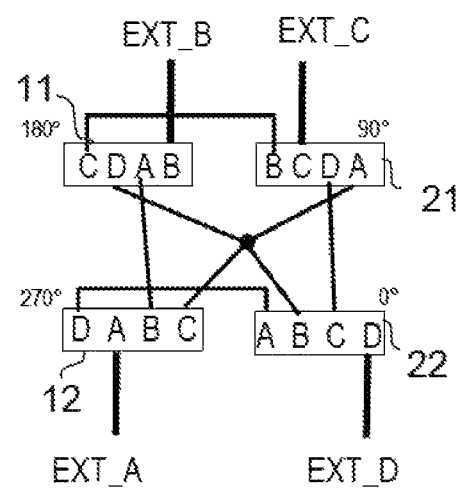
Figure 10C:
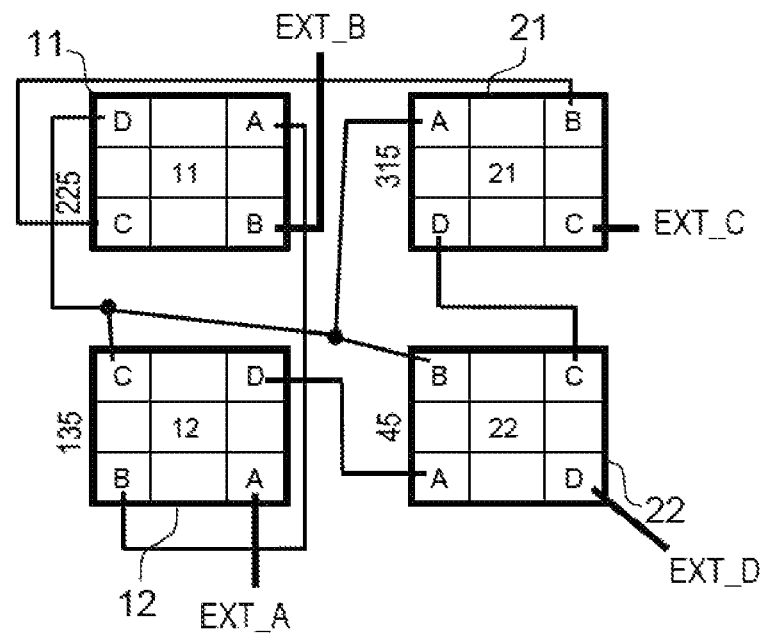

In the embodiments according to FIG. 10A and FIG. 10C, the Hall sensor elements are contacted on defined corners similar to the embodiment according to FIG. 6 in order to make available the respective element terminals A, B, C, D. Adjacent Hall sensor elements are arranged such that they are respectively turned relative to one another by 90°. The sensor terminal EXT_A is connected to the element terminal A of the element 12, the sensor terminal EXT_B is connected to the element terminal B of the element 11, the sensor terminal EXT_C is connected to the element terminal C of the element 21 and the sensor terminal EXT_D is connected to the element terminal D of the element 22. In addition, all four Hall sensor elements are interconnected at one of their element terminals, namely at the terminal A of the element 21, the terminal B of the element 22, the terminal C of the element 12 and the terminal D of the element 11. A respective connection to an adjacently arranged element is further provided in the same fashion. In this case, the terminal B of the element 12 is connected to the terminal A of the element 11, the terminal C of the element 11 is connected to the terminal B of the element 21, the terminal D of the element 21 is connected to the terminal C of the element 22 and the terminal A of the element 22 is connected to the terminal D of the element 12. The rotation of the elements is indicated with values of the corresponding angles 45, 135, 225, 315 (in degrees). The rotating direction differs in the embodiments according to FIG. 10A and FIG. 10C.

A form of rotational symmetry or point symmetry of the Hall sensor is achieved due to the illustrated and described connections of the individual Hall sensor elements. In addition to the above-discussed offset compensation effects, the symmetry also makes it possible to achieve a balanced operating behavior of the Hall sensor in terms of different contacting options.

Figure 10D:
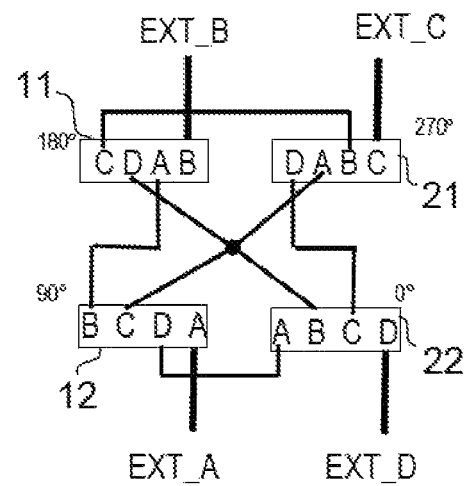

FIG. 10B and FIG. 10D show a comparable interconnection principle for vertical Hall sensor elements. In this case, corresponding angles of 0°, 90°, 180° and 270° are produced by rotating the contacts of the element terminals A, B, C, D accordingly. In this case, the respective Hall sensor element 11 has a terminal sequence C-D-A-B, the Hall sensor element 12 in FIG. 10B and the element 21 in FIG. 10D respectively have a terminal sequence D-A-B-C, the respective element 22 has a terminal sequence A-B-C-D and the element 21 in FIG. 10B and the element 12 in FIG. 10D respectively have a terminal sequence B-C-D-A. A connection of the individual element terminals is nominally realized identical to the embodiment with lateral Hall sensor elements illustrated in FIG. 10A and FIG. 10C. Accordingly, similar effects with respect to the symmetry, the offset reduction and the improved operating behavior are also achieved for the respective Hall sensors illustrated in FIG. 10B and in FIG. 10D. The rotating direction of the element terminals differs in the embodiments according to FIG. 10B and FIG. 10D.

The principle described with reference to FIG. 10 is schematically illustrated in FIG. 11, wherein the respective orientation of the Hall sensor elements is indicated with arrows analogous to FIG. 2 and FIG. 8. This figure clearly shows that any rotation by 90° once again results in the same image with respect to the alignment of the individual Hall sensor elements and the contacting of the sensor terminals.

FIG. 12 shows different embodiments of this principle in the form of an 8×8 grid with 64 Hall sensor elements. In this case, the respective orientation of the individual Hall sensor elements is indicated with arrows.

In FIG. 12A, each quadrant is realized with identically aligned Hall sensor elements.

In the embodiment illustrated in FIG. 12B, L-shaped arrangements of Hall sensor elements with an identical orientation are provided in each quadrant, wherein each L-shape comprises elements that are turned by 90° relative to the adjacent L-shape. However, the overall Hall sensor is once again realized symmetrically referred to any rotation by 90°.

FIG. 12C shows another embodiment with quadrants that are respectively turned symmetrically to one another, wherein each Hall sensor element is turned by 90° referred to its neighbor.

Due to their symmetric design, the different embodiments illustrated in FIG. 10, FIG. 11 and FIG. 12 have a sound offset compensation and a favorable operating behavior. The respectively chosen orientations of the individual Hall sensor elements should not be interpreted in a restrictive sense such that the illustrated embodiments merely serve as examples for other potential embodiments.

FIG. 13 shows another exemplary embodiment of a Hall sensor, in which three Hall sensor elements 1, 2, 3 that respectively comprise three element terminals A, B, C are interconnected in such a way that a similar or identical electrical behavior is achieved with respect to a rotational symmetry. For this purpose, the element terminals A of the three Hall sensor elements 1, 2, 3 are jointly connected. In addition, a respective element terminal B is connected to the element terminal C of an adjacent element such that, for example, the element terminal B of the element 1 is connected to the element terminal [C] of the element 2, the element terminal B of the element 2 is connected to the element terminal C of the element 3 and the element terminal B of the element 3 is connected to the element terminal C of the element 1. A sensor terminal EXT_A, EXT_B, EXT_C is respectively provided at each of these connections between the element terminals B, C. The interconnection corresponds to a respective relative rotation between the Hall sensor elements by 120°.

Due to the illustrated interconnection, for example, an electrical behavior between the terminals EXT_A, EXT_B is identical or essentially identical to an electrical behavior between the terminals EXT_B, EXT_C and between the terminals EXT_C and EXT_A. In this case, it is assumed that the Hall sensor elements 1, 2, 3 have an identical behavior. In order to operate the Hall sensor, two sensor terminals are respectively used for supplying the Hall sensor, for example, with a BIAS current while the third sensor terminal is used for tapping a Hall voltage. Instead of the vertical Hall sensor elements shown, it is also possible to use lateral Hall sensor elements with three element terminals that are correspondingly turned.

In the above-described exemplary embodiments of the Hall sensor, the individual Hall sensor elements are arranged on the semiconductor body in a square or rectangular surface area. Although such a shape can be advantageously implemented, it should merely be interpreted as an example of the arbitrary shape of a Hall sensor with corresponding interconnected Hall sensor elements. In other embodiments, any other shapes may also be chosen for the surface area on which the Hall sensor elements are arranged.

FIG. 14 shows other embodiments of a Hall sensor with several Hall sensor elements, in which a cruciform shape is chosen for the surface area. In this case, FIG. 14A shows an embodiment with lateral Hall sensor elements whereas FIG. 14B shows an embodiment with vertical Hall sensor elements. Five Hall sensor elements 12, 21, 22, 23, 32 are respectively provided in this case and arranged in such a way that the Hall sensor elements 12, 21, 23, 32 are arranged around the Hall sensor element 22. The sensor terminal EXT_A is connected to the element terminal A of the element 12 whereas the sensor terminal EXT_B is connected to the element terminal B of the element 21, the sensor terminal EXT_C is connected to the element terminal C of the element 32 and the sensor terminal EXT_D is connected to the element terminal D of the element 23. The elements 12, 21, 22, 23, 32 are arranged such that they are not turned relative to one another. Accordingly, the element terminal A of the element 22 is connected to the element terminal C of the element 12, the element terminal B of the element 22 is connected to the element terminal D of the element 21, the element terminal C of the element 22 is connected to the element terminal A of the element 32 and the element terminal D of the element 22 is connected to the element terminal B of the element 23. Individual element terminals are not contacted and therefore neither connected to other element terminals nor to sensor terminals.

During the operation of the Hall sensors illustrated in FIG. 14A and FIG. 14B, a voltage applied to the respective sensor terminals EXT_A, EXT_C or EXT_B, EXT_D is divided over the Hall sensor elements lying in between and in turn leads to a reduced E-field in the individual Hall sensor elements. In this way, the residual offset or the residual offset voltage can be maintained low.

FIG. 15 shows a schematic illustration of the arrangement of the Hall sensor elements according to the embodiments in FIG. 14A and FIG. 14B. The accordant orientation of the Hall sensor elements 12, 21, 22, 23, 32 is indicated with corresponding arrows analogous to FIG. 2.

The cruciform shape can once again be arbitrarily enlarged such that the resulting Hall sensor comprises a larger number of Hall sensor elements. This is illustrated in an exemplary fashion in the embodiment according to FIG. 16. In this case, the Hall sensor respectively comprises eight Hall sensor elements in the directions of the limbs. The limbs of the cross respectively have a width of four Hall sensor elements. The Hall sensor elements arranged on the edge of a limb are connected to a respective sensor terminal. For example, the Hall sensor elements 13, 14, 15, 16 are connected to the sensor terminal EXT_A, the Hall sensor elements 31, 41, 51, 61 are connected to the sensor terminal EXT_B, the Hall sensor elements 83, 84, 85, 86 are connected to the sensor terminal EXT_C and the Hall sensor elements 38, 48, 58, 68 are connected to the sensor terminal EXT_D. The individual Hall sensor elements of the Hall sensor are arranged with different orientations that are indicated with correspondingly aligned arrows analogous to several of the preceding embodiments.

In addition to the already described property of a low offset voltage or low residual offset voltage, the cruciform shape of the Hall sensor is also characterized in that low or negligible cross currents between adjacent sensor terminals occur during operation. For example, a current flow between the sensor terminals EXT_A and EXT_C and between the sensor terminals EXT_B and EXT_D is respectively desirable during operation whereas no current flow should take place, for example, between the terminals EXT_A and EXT_B. Due to the fact that no Hall sensor elements are provided in the free corners of the cross, i.e. that the elements 11, 12, 21, 22 are missing, for example, in comparison with FIG. 4, no current flow takes place at these locations. Among other things, this improves the sensitivity of the Hall sensor.

FIG. 17 once again shows a square or rectangular Hall sensor with an 8×8 grid similar to that illustrated in FIG. 4. In FIG. 4, the two central Hall sensor elements of each side are respectively connected to one of the sensor terminals EXT_A, EXT_B, EXT_C, EXT_D whereas the number of connected Hall sensor elements is increased to four in the embodiment according to FIG. 17. Accordingly, the sensor terminal EXT_A is connected to the Hall sensor elements 13, 14, 15, 16, the sensor terminal EXT_B is connected to the Hall sensor elements 31, 41, 51, 61, the sensor terminal EXT_C is connected to the Hall sensor elements 83, 84, 85, 86 and the sensor terminal EXT_D is connected to the Hall sensor elements 38, 48, 58, 68.

Due to the larger number of Hall sensor elements that are connected to a sensor terminal, a lower input resistance between the corresponding sensor terminals is achieved during the operation of the Hall sensor. This input resistance has an influence, for example, on the thermal noise that affects the accuracy of the Hall sensor. The input resistance of the Hall sensor generally decreases as the number of externally connected Hall sensor elements increases. In addition, the accuracy of the Hall sensor increases as the input resistance decreases. However, a higher input resistance requires a higher operating current in order to reach a desired order of magnitude of the Hall voltage of the Hall sensor. This is the reason why a lower input resistance usually causes increased energy consumption during the operation of the Hall sensor. Consequently, the choice of the desired input resistance or the desired number of externally contacted Hall sensor elements can be varied in accordance with the specific application.

FIG. 18 shows other embodiments of a Hall sensor, in which all sensor terminals are arranged on one side of the interconnected Hall sensor elements 11, . . . , 94. As an example, the illustrations in FIG. 18 respectively show only four and five rows of a circuit matrix of Hall sensor elements, wherein the number of rows may also be chosen higher or differently, for example, in order to realize a square circuit matrix of Hall sensor elements.

Figure 18A:
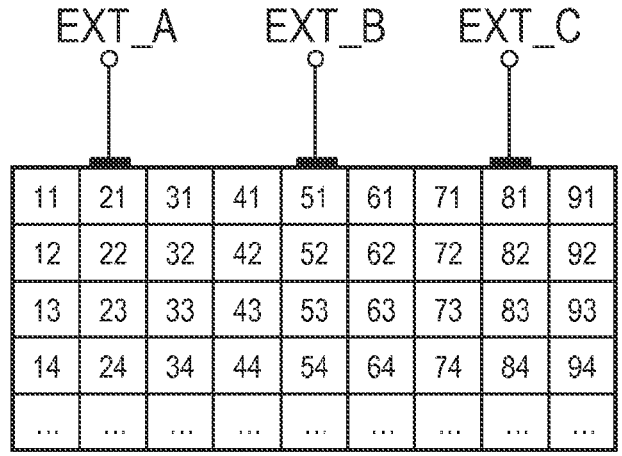

In FIG. 18A, three sensor terminals EXT_A, EXT_B, EXT_C are provided, wherein the sensor terminal EXT_A is connected to the Hall sensor element 21, the sensor terminal EXT_B is connected to the Hall sensor element 51 and the sensor terminal EXT_C is connected to the Hall sensor element 81. During the operation of a Hall sensor of the type illustrated in FIG. 18A, a measurement is carried out, for example, by applying a supply signal to two of the sensor terminals while a Hall voltage is measured with respect to a reference potential at the third sensor terminal.

Figure 18B:
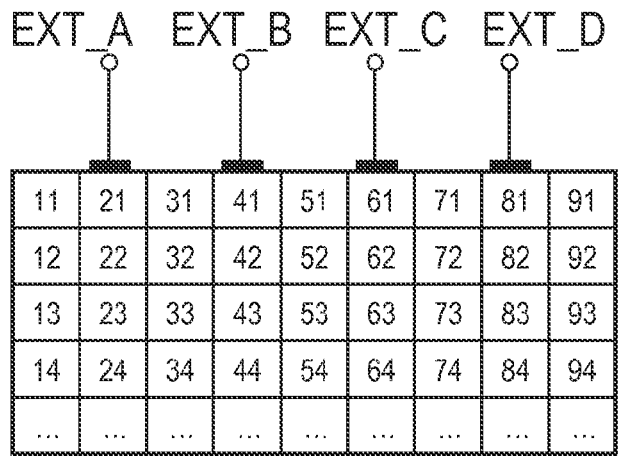

FIG. 18B shows an embodiment of a Hall sensor, in which four sensor terminals EXT_A, EXT_B, EXT_C, EXT_D are provided in accordance with the above-described exemplary embodiments. In this case, the sensor terminal EXT_A is connected to the Hall sensor element 21, the sensor terminal EXT_B is connected to the Hall sensor element 41, the sensor terminal EXT_C is connected to the Hall sensor element 61 and the sensor terminal EXT_D is connected to the Hall sensor element 81.

Figure 18C:
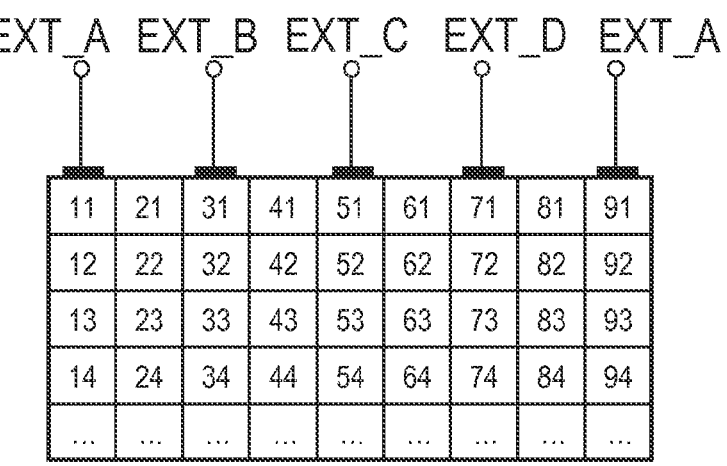

FIG. 18C shows another embodiment of a Hall sensor, in which five sensor terminals are provided. Analogous to the embodiment of the vertical Hall sensor element in FIG. 3B, one external sensor terminal EXT_A is realized in the form of a double sensor terminal in this case. Accordingly, the sensor terminal EXT_A is connected to the Hall sensor elements 11 and 91, the sensor terminal EXT_B is connected to the Hall sensor element 31, the sensor terminal EXT_C is connected to the Hall sensor element 51 and the sensor terminal EXT_D is connected to the Hall sensor element 71 in this embodiment.

Regardless of the number of sensor terminals used in the embodiments according to FIG. 18, it is possible to respectively interconnect Hall sensor elements, for example, with four or five element terminals. Externally, i.e. at the sensor terminals, the Hall sensor behaves in accordance with the chosen number of sensor terminals provided.

FIG. 19 shows another embodiment of a Hall sensor that is based on the embodiment according to FIG. 4 or FIG. 17. Analogous to FIG. 4, the sensor terminal EXT_A is permanently connected to the Hall sensor elements 14, 15, the sensor terminal EXT_B is permanently connected to the Hall sensor elements 41, 51, the sensor terminal EXT_C is permanently connected to the Hall sensor elements 84, 85 and the sensor terminal EXT_D is permanently connected to the Hall sensor elements 48, 58. In addition, a switchable connection between the sensor terminals EXT_A, EXT_B, EXT_C, EXT_D and the elements that respectively lie adjacent to the permanently connected Hall sensor elements is provided. Accordingly, the sensor terminal EXT_A is connected in a switchable fashion to the Hall sensor elements 13, 16, the sensor terminal EXT_B is connected in a switchable fashion to the Hall sensor elements 31, 61, the sensor terminal EXT_C is connected in a switchable fashion to the Hall sensor elements 83, 86 and the sensor terminal EXT_D is connected in a switchable fashion to the Hall sensor elements 38, 68, namely via a respective switch that can be activated by means of a control signal ACT.

In such an interconnection, for example, the Hall sensor can be operated in two operating modes, namely an idle mode or standby mode and an active mode or normal mode. For example, the Hall sensor is expected to have low accuracy in the idle mode such that the switches controlled by means of the control signal ACT are opened. This results in a higher input resistance of the Hall sensor that in turn causes a lower current and therefore a reduced energy consumption. Nevertheless, the Hall sensor is still functional and able to measure a magnetic field signal, although with a lower accuracy or sensitivity. The Hall sensor accordingly operates in a high-resistance mode.

If higher accuracy is desired, it is possible to change over into the active mode by closing the switches with a corresponding control signal ACT. This causes the Hall sensor to operate in a low-resistance mode. Consequently, a more accurate or more sensitive measurement can be carried out with the Hall sensor in the active mode. For example, the change-over between the idle mode and the active mode can be realized with an external control or based on a measuring signal of the Hall sensor in the idle mode, for example when a limiting value is exceeded during the measurement with the Hall sensor.

Depending on the number of Hall sensor elements used, it is also possible to connect a larger number of additional Hall sensor elements to the sensor terminals in the active mode. As an example, a square or rectangular shape is chosen in FIG. 19, but this square or rectangular shape may in other embodiments also be replaced with different surface area shapes such as, for example, the cruciform shape illustrated in FIG. 16.

When choosing the Hall sensor elements to be contacted, it must be taken into consideration that connected Hall sensor elements can promote the occurrence of undesirable short circuit currents between adjacent sensor terminals across the corners.

Other modifications of the above-described embodiments can be realized by choosing a different shape or a different number of element terminals of the Hall sensor elements used. In the embodiments described so far, square or rectangular lateral Hall sensor elements with three or four element terminals or corresponding vertical Hall sensor elements with four contacts were used. With respect to vertical Hall sensor elements, it would also be possible to utilize an element with five contacts, in which the element terminal A is divided into two contacts as illustrated in FIG. 3B. It is further possible to utilize vertical Hall sensor elements with four contacts and two external short-circuited contacts.

In different variations of the embodiments illustrated in FIG. 2, FIG. 4, FIG. 8, FIG. 9, FIG. 12, FIG. 17, FIG. 18 and FIG. 19, the contacting between the Hall sensor elements can be realized in the corners and/or on the lateral faces, particularly if the Hall sensor elements are realized in the form of lateral Hall sensor elements. The interconnection is therefore realized, for example, in accordance with FIG. 5 or FIG. 6.

As an example, FIG. 20 shows that a triangular shape may also be chosen for an individual element, particularly a lateral Hall sensor element. This figure shows two triangular Hall sensor elements 1, 2 with respective element terminals A, B, C. A different shape may also be chosen instead of the triangular shape, wherein the Hall sensor element respectively comprises three element terminals. In this case, the element terminal A of an element is respectively electrically connected to the element terminal C of the other element. Two triangular Hall sensor elements 1, 2 with three respective element terminals A, B, C that are interconnected in this way practically behave like a rectangular or square lateral Hall sensor element with four element terminals A, B, C, D, wherein this is indicated with the equals sign in FIG. 20.

The interconnection concept of the two Hall sensor elements 1, 2 illustrated in the left half of FIG. 20 can also be transferred to vertical Hall sensor elements. As an example, this is illustrated in FIG. 21 with two vertical Hall sensor elements that respectively comprise three element terminals A, B, C. The element terminals A(1), B(1), C(1) of the first Hall sensor element 1 are accordingly interconnected with the element terminals A(2), B(2), C(2) of the second Hall sensor element 2, wherein an electric contact is respectively produced, in particular, between the element terminals A(2) and C(1) and between the element terminals A(1) and C(2). This practically also corresponds to a conventional vertical Hall sensor element with four terminals A-B-C-D or five terminals A-B-C-D-A or four terminals with external short circuit E-A-B-C-D-E, wherein this is once again indicated with the equals sign in FIG. 21.

FIG. 22 shows another embodiment of a Hall sensor with several Hall sensor elements that are realized triangular in this case. The Hall sensor comprises, in particular, eight Hall sensor elements 1, 2, . . . , 8 that respectively comprise three element terminals A, B, C. Element terminals of the individual Hall sensor elements that directly border on one another are electrically connected to one another. For example, the element terminal A of the element 1 is connected to the element terminal C of the element 2 and the element terminal B of the element 5. Furthermore, the centrally arranged terminals of the elements 2, 3, 4, 5, 6, 7 are electrically contacted. Sensor terminals of the Hall sensor may be provided, for example, on the corners of the resulting square or rectangle. Alternatively, the sensor terminals may also be arranged centrally on the sides of the square or rectangle. Furthermore, the terminals that are centrally arranged on the sides, as well as the terminals that are arranged on the corners, can be used as sensor terminals of the Hall sensor such that a Hall sensor with eight sensor terminals is realized.

FIG. 23 shows another embodiment of a Hall sensor with several Hall sensor elements 11, 12, 21, 22 that respectively comprise eight element terminals A, B, C, D, E, F, G, H in this embodiment. Each of the Hall sensor elements 11, 12, 21, 22 may consist of a complete square or rectangular lateral Hall sensor with eight element terminals or, for example, a Hall sensor with eight terminals of the type illustrated in FIG. 22. The element terminals of the individual Hall sensor elements that are arranged adjacent to one another are once again electrically connected to one another. For example, the respective element terminals H and G of the element 11 are connected to the respective element terminals B and C of the element 12. Furthermore, the terminal F of the element 11 is connected to the terminal H of the element 21, the terminal B of the element 22 and the terminal D of the element 12. Other connections can be ascertained directly from the figures and are not discussed in greater detail at this point in order to avoid repetitions.

The resulting Hall sensor according to FIG. 23 can once again be used as a Hall sensor with four sensor terminals that are contacted, for example, on the respective corners of the square or rectangular shape or on the lateral centers of this shape. Analogous to the embodiment illustrated in FIG. 22, it is furthermore possible to realize a Hall sensor with eight sensor terminals that is contacted on the corners, as well as on the lateral centers.

In FIG. 22 and FIG. 23, the entire square or rectangular surface area of the Hall sensor is filled with individual Hall sensor elements. However, certain regions of a square or rectangular surface area of a Hall sensor may also remain unoccupied. FIG. 24 shows an embodiment of a Hall sensor that has a basically square or rectangular shape and comprises eight triangular Hall sensor elements 1, 2, . . . , 8 that only cover half of the available surface area. A diamond that is respectively formed by two triangular Hall sensor elements is provided in each quadrant of the Hall sensor in this case. As in the preceding embodiments according to FIG. 22 or FIG. 23, bordering or adjacent element terminals of the individual Hall sensor elements are electrically connected to one another, for example, such that the element terminals B of the elements 2 and 5 or of the elements 4 and 7 are connected to one another or the terminals A are connected to the terminals C of the respectively adjacent Hall sensor element.

The embodiment shown results in a Hall sensor with four sensor terminals that are formed by the element terminals B of the elements 1 and 3, the external element terminals A, C of the elements 3, 4, 7, 8, the element terminals B of the elements 6, 8, as well as the external element terminals A, C of the elements 1, 2, 5, 6.

In essence, this practically corresponds to a Hall sensor with four rectangular or square Hall sensor elements 11, 12, 21, 22 of the type illustrated in FIG. 25. For example, the Hall sensor element 11 is formed by a combination of the triangular elements 1 and 2, the Hall sensor element 21 is formed by a combination of the elements 3 and 4, etc. With respect to the circuitry, the embodiment illustrated in FIG. 25 therefore can be traced back to the variation of the Hall sensor realized in accordance with FIG. 1, wherein each of the square or rectangular Hall sensor elements is composed of two triangular Hall sensor elements in accordance with the arrangement illustrated in FIG. 24.

Although lateral Hall sensor elements are illustrated as examples in FIGS. 22 to 25, a corresponding interconnection can also be produced between vertical Hall sensor elements. This may also be realized with consideration of the relationships illustrated in FIG. 21. The embodiments illustrated in FIGS. 22 to 25 represent examples of a grid-like interconnection of Hall sensor elements.

Figure 26A:
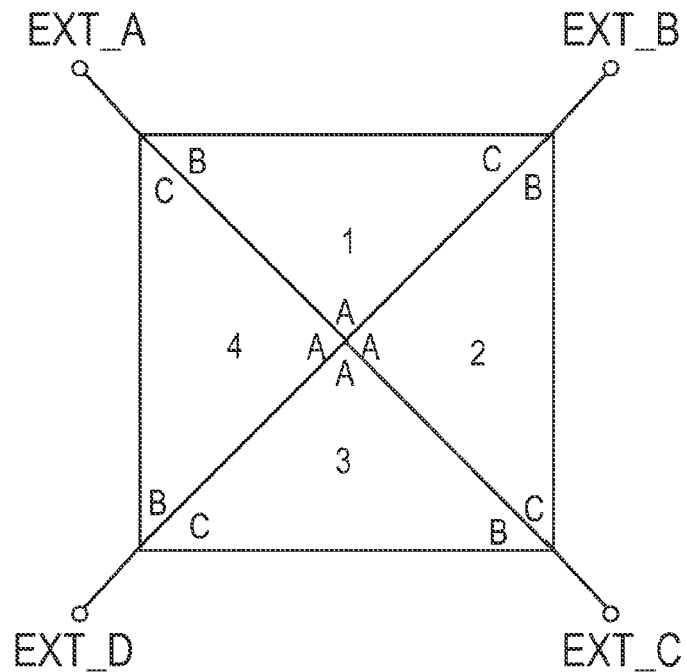
Figure 26B:
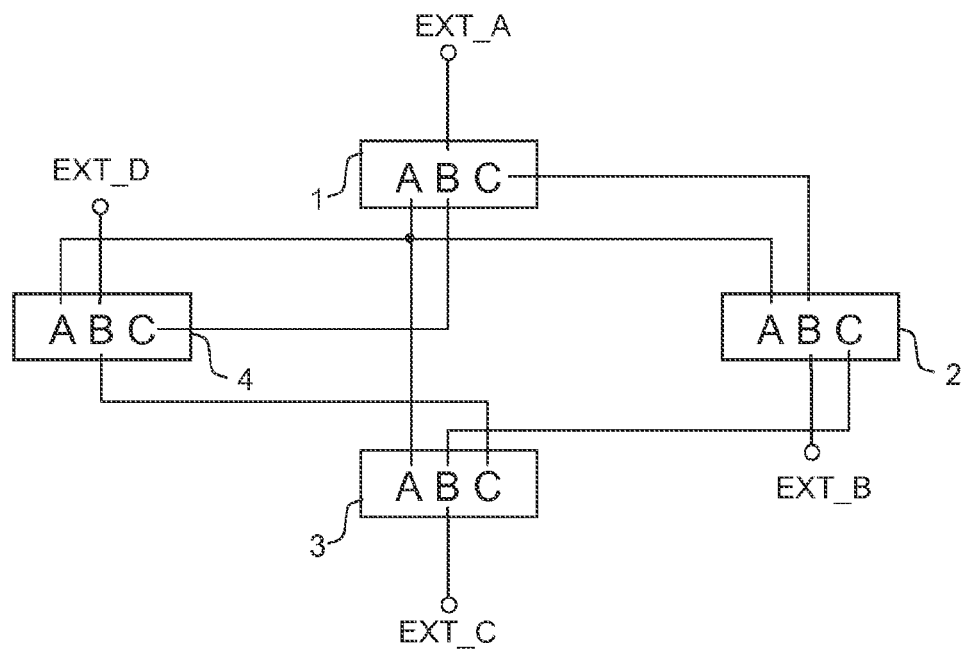

FIG. 26 shows another exemplary embodiment of a Hall sensor, in which Hall sensor elements 1, 2, 3, 4 that respectively comprise three element terminals A, B, C are interconnected. In this case, FIG. 26A shows an embodiment with lateral Hall sensor elements that, for example, have a triangular shape whereas FIG. 26B shows a corresponding embodiment with vertical Hall sensor elements.

In this embodiment, the respective element terminals A of the Hall sensor elements 1, 2, 3, 4 are interconnected or connected to one another. In FIG. 26A, this is implemented, for example, due to the division of a rectangular or square surface area into four triangular surface areas. Furthermore, the element terminals B of a Hall sensor element are respectively connected to an element terminal C of an adjacent Hall sensor element, wherein this is respectively illustrated in FIG. 26A, for example, in the form of the adjacent arrangement of the Hall sensor elements and the opposing element terminals B, C. The common connections of the element terminals B, C respectively form one of the four sensor terminals EXT_A, EXT_B, EXT_C, EXT_D. The interconnection corresponds to a respective relative rotation between the Hall sensor elements by 90°.

Similar to the embodiments illustrated in FIG. 10 to FIG. 13, the interconnection of the Hall sensor elements illustrated in FIG. 26 results in a form of rotational symmetry such that, for example, an electrical behavior between the sensor terminals EXT_A and EXT_C is identical or essentially identical to an electrical behavior between the sensor terminals EXT_B and EXT_D. The embodiments illustrated in FIG. 26 can also be realized with a larger number of Hall sensor elements. The variant with four Hall sensor elements illustrated in FIG. 26 was merely chosen in order to provide a better overview.

In addition to the shapes shown, it is also possible to choose other shapes for the surface area of the Hall sensor. Furthermore, the surface area can also be divided into the individual Hall sensor elements in different ways. For example, if equilateral triangles are chosen for the division of the surface area of a lateral Hall sensor, six such triangles can be combined into a Hall sensor with six sensor terminals. Such a lateral Hall sensor with six contacts also corresponds, for example, to a vertical Hall sensor with six contacts. The disclosed combination of the Hall sensor elements in the form of six respectively equilateral triangles makes it possible to divide the surface area of the Hall sensor into a honeycomb-like structure with several hexagons.

In the embodiments shown, the Hall sensor elements, particularly the lateral Hall sensor elements, are furthermore illustrated as square, rectangular or cruciform. However, the Hall sensor elements may also be realized as polygonal or round or with any known shape such as, for example, the shape of a bridge, the shape of a cloverleaf or the like. In this respect, the illustrated embodiments therefore should merely be interpreted as examples for different optional variations.

In the above-described embodiments of the Hall sensor, the internal connections between the element terminals of the individual Hall sensor elements are realized in the form of permanent connections, for example in the form of direct electric contact. In other modifications, however, it is possible to realize the internal connections between the element terminals of the Hall sensor elements in a switchable fashion, e.g., by means of transistors. For example, two or more different internal switching configurations accordingly can be adjusted, wherein one of the above-described exemplary embodiments is preferably implemented in each adjusted switching configuration. It is therefore possible to change over the operating behavior of the Hall sensor. For this purpose, for example, a switching matrix with a corresponding number of transistors is provided in order to change over the Hall sensor from a first internal switching configuration to a second internal switching configuration.

In some of the above-described embodiments of Hall sensors with several Hall sensor elements, the respective Hall sensor is composed of at least three Hall sensor elements. In addition, each Hall sensor element comprises three element terminals in the case of triangular Hall sensor elements and four or more element terminals in the case of square or rectangular Hall sensor elements. The minimum of three element terminals of the Hall sensor elements used also applies to vertical Hall sensor elements. The sensor terminals of the described Hall sensors are respectively connected to at least one of the Hall sensor elements at least at one of its element terminals. Furthermore, on at least two of the Hall sensor elements or on all of the Hall sensor elements, at least one element terminal that is not connected to a sensor terminal is connected to exactly one element terminal of another Hall sensor element, particularly an adjacent Hall sensor element that is also not connected to a sensor terminal. It is preferred that no more than two element terminals of each Hall sensor element be respectively connected to one of the sensor terminals.

In all above-described embodiments of Hall sensors with several Hall sensor elements, the respective Hall sensor elements preferably are respectively interconnected in a grid with a structure that is more than one-dimensional or in an array with more than one row and more than one column.

As an example, FIG. 27 shows the layout of a Hall sensor with a 64×64 grid of vertical Hall sensor elements that are interconnected in accordance with the above-described principle. The Hall sensor comprises four sensor terminals EXT_A, EXT_B, EXT_C, EXT_D. FIG. 27 further shows an enlarged detail of the grid, in which the individual vertical Hall sensor elements are illustrated more clearly. This detail shows, in particular, that the individual Hall sensor elements are realized with five element terminals, e.g., as illustrated in an exemplary fashion in FIG. 3B.

In the embodiment shown, a magnetic field is measured, in particular, parallel to the surface of the semiconductor body, wherein said magnetic field also extends perpendicular to the longer side of the rectangular surface area of the Hall sensor.

In other embodiments, it is also possible to combine two Hall sensors that respectively comprise several vertical Hall sensor elements in such a way that the Hall sensor elements of one Hall sensor, as well as the Hall sensor elements of the other Hall sensor, are arranged on a common surface area, wherein the vertical Hall sensor elements of the one Hall sensor are turned relative to the vertical Hall sensor elements of the other Hall sensor by an angle, in particular, of 90°. Consequently, a measurement of orthogonal magnetic field components can be carried out parallel to the surface of the semiconductor body on the spatially identical surface area of the semiconductor body.

Although predominantly rectangular or cruciform shapes of the Hall sensor have been shown in the embodiments above, other shapes of the surface area of such Hall sensor can be employed. For example, FIG. 28A shows an example of a Hall sensor with a circular shape, FIG. 28B shows an example of a Hall sensor with a hexagon shape, and FIG. 28C shows an example of a Hall sensor with an octagon shape. More generally speaking, the hexagon shape and the octagon shape stand as an example for other polygon shapes, in particular shapes of an even polygon.

In the above-described embodiments, potential variations and modifications were predominantly illustrated and described separately of one another. However, the different individual modifications and embodiments can be arbitrarily combined with one another. In this way, it is possible to realize diverse embodiments of Hall sensors that respectively have advantageous properties with respect to an offset voltage or residual offset voltage and are characterized by high accuracy or sensitivity of the magnetic field measurement.

The invention claimed is:

1. A Hall sensor with at least three Hall sensor elements, that respectively comprise at least three element terminals and are interconnected in a circuit lattice with a structure that is more than one-dimensional, and with at least three sensor terminals for contacting the Hall sensor, wherein the Hall sensor is configured such that:
the at least three interconnected Hall sensor elements are contactable as a single Hall sensor via the sensor terminals,
each sensor terminal is connected to at least one of the Hall sensor elements at one of its element terminals, and
at least one element terminal of each Hall sensor element is respectively not connected to one of the sensor terminals.

2. The Hall sensor according to claim 1, wherein at least one signal path is in each possible combination of two respective sensor terminals formed between these two sensor terminals, and wherein a number of Hall sensor elements that are connected in this signal path is smaller than a total number of the Hall sensor elements of the Hall sensor.

3. The Hall sensor according to claim 1 or 2, wherein at least one element terminal of at least two of the Hall sensor elements that is not connected to one of the sensor terminals is connected to another Hall sensor element at exactly one of its element terminals that is not connected to one of the sensor terminals.

4. The Hall sensor according to claim 1, wherein the Hall sensor elements are arranged within a defined surface area shape.

5. The Hall sensor according to claim 4, wherein the surface area shape has at least one symmetric property and one of the following shapes:
a rectangular shape;
a square shape;
a cruciform shape;
a circular shape;
the shape of an even polygon;
the shape of a hexagon; or
the shape of an octagon.

6. The Hall sensor according to claim 4 or 5, wherein the Hall sensor elements that are connected to the sensor terminals are respectively arranged such that they border on the outer edge of the surface area.

7. The Hall sensor according to claim 4, wherein the Hall sensor elements that are not arranged such that they border on the outer edge of the surface area are respectively connected to exactly one element terminal of an adjacent Hall sensor element at all of its element terminals.

8. The Hall sensor according to claim 7, wherein the Hall sensor elements that are not arranged such that they border on the outer edge of the surface area are connected to respectively different adjacent Hall sensor elements at their element terminals.

9. The Hall sensor according to claim 1, wherein at least one connection between one of the sensor terminals and one of the element terminals respectively consists of a permanent connection.

10. The Hall sensor according to claim 9, wherein the sensor terminals respectively comprise at least one switchable connection with at least one other Hall sensor element at one of its element terminals in addition to the permanent connection.

11. The Hall sensor according to claim 1, wherein the Hall sensor elements have an identical design and respectively comprise at least four element terminals that are formed by a first pair of element terminals and at least one second pair of element terminals, wherein for at least some of the Hall sensor elements:
a first element terminal of the first pair of one Hall sensor element is connected to one of the element terminals of the second pair of another Hall sensor element; and
a first element terminal of the second pair of this Hall sensor element is connected to one of the element terminals of the first pair of yet another Hall sensor element.

12. The Hall sensor according to claim 1, wherein the Hall sensor elements have an identical design and respectively comprise at least four element terminals that are formed by a first pair of element terminals and at least one second pair of element terminals, wherein for at least some of the Hall sensor elements:
a first element terminal of the first pair of one Hall sensor element is connected to a second element terminal of the first pair of another Hall sensor element; and
a first element terminal of the second pair of this Hall sensor element is connected to a second element terminal of the second pair of yet another Hall sensor element.

13. The Hall sensor according to claim 12, wherein all Hall sensor elements have an identical orientation with respect to an alignment of the first and second pair.

14. The Hall sensor according to claim 12, wherein at least some of the Hall sensor elements have a different orientation with respect to an alignment of the first and second pair.

15. The Hall sensor according to claim 1, wherein the Hall sensor elements consist of lateral Hall sensor elements.

16. The Hall sensor according to claim 1, wherein the Hall sensor elements consist of vertical Hall sensor elements.

17. The Hall sensor according to claim 1, with at least four Hall sensor elements that have an identical design and respectively comprise a first, a second, a third and a fourth element terminal, wherein a common connection is in at least one group of four of the Hall sensor elements formed between the first element terminal of a first Hall sensor element of the group, the second element terminal of a second Hall sensor element of the group, the third element terminal of a third Hall sensor element of the group and the fourth element terminal of a fourth Hall sensor element of the group.

18. The Hall sensor according to claim 1, with at least four Hall sensor elements that have an identical design and respectively comprise a first, a second, a third and a fourth element terminal, wherein a common connection is in at least one group of four of the Hall sensor elements formed between:
- the respective first element terminal of the Hall sensor elements of the group; or
- the first element terminal of a first Hall sensor element of the group, the third element terminal of a second Hall sensor element of the group, the first element terminal of a third Hall sensor element of the group and the third element terminal of a fourth Hall sensor element of the group.

19. The Hall sensor according to claim 1, with at least four Hall sensor elements that respectively comprise at least three element terminals, and with a first, a second, a third and a fourth sensor terminal, wherein two of the sensor terminals respectively form a first and a second pair, wherein the Hall sensor elements are interconnected, particularly with a point symmetry, in such a way that an electrical behavior between the sensor terminals of the first pair is identical to an electrical behavior between the sensor terminals of the second pair.

20. The Hall sensor according to claim 1, with at least three Hall sensor elements that respectively comprise three element terminals, and with a first, a second and a third sensor terminal, wherein a respective combination of two of the sensor terminals forms a first, a second and a third pair, wherein the Hall sensor elements are interconnected, particularly with a point symmetry, in such a way that an electrical behavior between the sensor terminals of the first, the second and the third pair is identical.

21. The Hall sensor according to claim 1, with at least four Hall sensor elements, including the at least three Hall sensor elements, that have an identical design, wherein at least one group of four of said Hall sensor elements have exactly one of the element terminals of each of the Hall sensor elements of said group connected together at a common connection point, said common connection point being free from any direct electrical connection to one of the sensor terminals.

22. The Hall sensor according to claim 1, with at least nine Hall sensor elements, including the at least three Hall sensor elements, that have an identical design, wherein at least four distinct groups of each four of said Hall sensor elements have exactly one of the element terminals of each of the Hall sensor elements of the respective group connected together at a respective common connection point, said common connection points being free from any direct electrical connection to one of the sensor terminals.

* * * * *